(12) United States Patent
Thambidorai et al.

(10) Patent No.: US 10,599,482 B2
(45) Date of Patent: Mar. 24, 2020

(54) METHOD FOR INTRA-SUBGRAPH OPTIMIZATION IN TUPLE GRAPH PROGRAMS

(71) Applicant: Google Inc., Mountain View, CA (US)

(72) Inventors: Gautham Thambidorai, Palo Alto, CA (US); Matthew Rosencrantz, Menlo Park, CA (US); Sanjay Ghemawat, Mountainview, CA (US); Srdjan Petrovic, Palo Alto, CA (US); Ivan Posva, Mountain View, CA (US)

(73) Assignee: Google LLC, Mountain View, CA (US)

( * ) Notice: Subject to any disclaimer, the term of this patent is extended or adjusted under 35 U.S.C. 154(b) by 91 days.

(21) Appl. No.: 15/685,055

(22) Filed: Aug. 24, 2017

(65) Prior Publication Data
US 2019/0065162 A1     Feb. 28, 2019

(51) Int. Cl.
*G06F 9/44*     (2018.01)
*G06F 9/50*     (2006.01)
(Continued)

(52) U.S. Cl.
CPC .............. *G06F 9/5066* (2013.01); *G06F 8/47* (2013.01); *G06F 8/443* (2013.01); *G06F 8/456* (2013.01); *G06F 17/504* (2013.01)

(58) Field of Classification Search
CPC ........ G06F 9/50; G06F 9/5005–9/5094; G06F 9/505; G06F 8/40; G06F 8/41; G06F 8/44;
(Continued)

(56) References Cited

U.S. PATENT DOCUMENTS 5,191,638 A    3/1993  Wakami et al.
5,630,051 A    5/1997  Sun et al.
(Continued)

FOREIGN PATENT DOCUMENTS

TW    200408955 A    6/2004
TW    200506646 A    2/2005
(Continued)

OTHER PUBLICATIONS

Office Action for Taiwanese Patent Application No. 107116380, dated Nov. 23, 2018.
(Continued)

*Primary Examiner* — Qamrun Nahar
(74) *Attorney, Agent, or Firm* — Lerner, David, Littenberg, Krumholz & Mentlik, LLP

(57) ABSTRACT

A programming model generates a graph for a program, the graph including a plurality of nodes and edges, wherein each node of the graph represents an operation and edges between the nodes represent streams of data input to and output from the operations represented by the nodes. The model determines where in a distributed architecture to execute the operations represented by the nodes. Such determining may include determining which nodes have location restrictions, assigning locations to each node having a location restriction based on the restriction, and partitioning the graph into a plurality of subgraphs, the partitioning including assigning locations to nodes without location restrictions in accordance with a first set of constraints, wherein each node within a particular subgraph is assigned to the same location. Each of the subgraphs is executed at its assigned location in a respective single thread.

18 Claims, 25 Drawing Sheets

(51) Int. Cl.
*G06F 8/41* (2018.01)
*G06F 17/50* (2006.01)

(58) Field of Classification Search
CPC ........ G06F 8/441; G06F 8/445; G06F 8/4451;
G06F 8/4452; G06F 8/45; G06F 8/451;
G06F 8/452; G06F 8/453; G06F 8/456;
G06F 8/457; G06F 8/458; G06F 8/60;
G06F 8/61; H04L 67/10; H04L 67/1002;
H04L 67/104
See application file for complete search history.

(56) References Cited

U.S. PATENT DOCUMENTS

| | | | |
|---|---|---|---|
| 6,292,938 | B1 | 9/2001 | Sarkar et al. |
| 6,651,246 | B1* | 11/2003 | Archambault .......... G06F 8/443 717/149 |
| 7,010,789 | B1* | 3/2006 | Kimelman ............ G06F 9/5066 718/100 |
| 7,120,902 | B2 | 10/2006 | Flanagan et al. |
| 7,720,779 | B1 | 5/2010 | Perry et al. |
| 7,958,493 | B2 | 6/2011 | Lindsey et al. |
| 8,473,971 | B2 | 6/2013 | Meijer et al. |
| 8,959,499 | B2 | 2/2015 | Chambers et al. |
| 9,311,149 | B2* | 4/2016 | Bird ...................... G06F 9/5016 |
| 9,626,202 | B2 | 4/2017 | Chambers et al. |
| 2002/0038451 | A1 | 3/2002 | Tanner et al. |
| 2004/0264481 | A1 | 12/2004 | Darling et al. |
| 2006/0167880 | A1 | 7/2006 | Meijer et al. |
| 2008/0232445 | A1* | 9/2008 | Forsell .................. G06F 9/5066 375/219 |
| 2009/0234801 | A1 | 9/2009 | Moor et al. |
| 2011/0301941 | A1 | 12/2011 | De Vocht |
| 2011/0314459 | A1 | 12/2011 | Husbands |
| 2012/0166373 | A1 | 6/2012 | Sweeney et al. |
| 2014/0068555 | A1 | 3/2014 | Chase et al. |
| 2014/0172939 | A1 | 6/2014 | McSherry et al. |
| 2014/0181828 | A1* | 6/2014 | Bird ...................... G06F 9/5016 718/103 |
| 2014/0310273 | A1 | 10/2014 | Mital et al. |
| 2015/0067653 | A1 | 3/2015 | Guamieri et al. |
| 2017/0124451 | A1* | 5/2017 | Barham ................ G06F 9/5038 |
| 2017/0124452 | A1* | 5/2017 | Tucker .................. G06F 9/5038 |
| 2017/0147303 | A1 | 5/2017 | Amy et al. |
| 2017/0193041 | A1 | 7/2017 | Fuchs |

FOREIGN PATENT DOCUMENTS

| | | |
|---|---|---|
| TW | 200813738 A | 3/2008 |
| TW | 200905559 A | 2/2009 |
| TW | 200947225 A | 11/2009 |
| TW | 201237639 A | 9/2012 |

OTHER PUBLICATIONS

Murray et al., Naiad: A Timely Dataflow System, SOSP'13, Nov. 2013, pp. 439-455.
Arpaci-Dusseau, Remzi H., Run-Time Adaptation in River, ACM Transaction on Computer Systems, vol. 21, No. 1, Feb. 2003, pp. 36-51.
Apache Storm, [online][Retrieved Jun. 22, 2017] Retrieved from internet: < http://storm.apache.org/index.html>, 3 pages.
Akidau et al., the Dataflow Model: A Practical Approach to Balancing Correctness, Latency, and Cost in MassiveScale, Unbounded, OutofOrder Data Processing, VLDB Endowment, vol. 8, No. 12, 2015, pp. 1792-1803.
Apache Flink: Scalable Stream and Batch Data Processing, [online][Retrieved Jun. 26, 2017] Retrieved from internet: < https://flink.apache.org/ >, 3 pages.
Zhong et al., Extending Multicore Architectures to Exploit Hybrid Parallelism in Single-thread Applications, HPCA '07 Proceedings of the 2007 IEEE 13th International Symposium on High Performance Computer Architecture, pp. 25-36.
Abadi et al., TensorFlow:Large-Scale Machine Learning on Heterogeneous Distributed Systems, Preliminary White Paper, Nov. 9, 2015, 19 pages.
Bellens et al., CellSs: a Programming Model for the Cell BE Architecture, 2006 ACM/IEEE SC|06 Conference (SC'06), 11 pages.
Liu, Xiaodong, A Programming Model for the Cloud Platform, International Journal of Advanced Science and Technology vol. 57, Aug. 2013, pp. 75-82.
Cupák, Miroslav, Parallelization of Query Processing in MedSavant, Masaryk University Faculty of Informatics, Diploma Thesis, 2014, 73 pages.
International Search Report and Written Opinion for Application No. PCT/US2018/033156, dated Aug. 31, 2018. 16 pages.
Townsend et al., From Functional Programs to Pipelined Dataflow Circuits, CC'17, Feb. 5-6, 2017, Austin, TX, pp. 76-86.
Sawyer et al., Evaluating Accumulo Performance for a Scalable Cyber Data Processing Pipeline, 2014 IEEE High Performance Extreme Computing Conference (HPEC), 7 pages.
Moustafa et al., Datalography: Scaling Datalog Graph Analytics on Graph Processing Systems, 2016 IEEE International Conference on Big Data (Big Data), Dec. 5-6, 2016, p. 56-65.
Khan et al.,Architectural support for task scheduling: hardward scheduling for dataflow on NUMA systems, Springer Science+Business Media New York 2015, published online Feb. 8, 2015, 31 pages.
Lesuisse, Arthur, Data Processing with Pig Latin, Universite Libre De Bruxelles, 2011, 85 pages.
Abadi et al., TesnorFlow: A System for Large-Scale Machine Learning, 12th USENIX Symposium on Operating Systems Design and Implementation (OSDI '16), Nov. 2-4, 2016, pp. 265-283.
Saint-Mleux et al., SHard: a Scheme to Hardware Compiler, Scheme Workshop, 2006, 11 pages.
Brophy, Jonathan, Survey of Techniques for Large-Scale Distributed Graph Processing,downloaded from internet Jul. 19, 2017, 13 pages.
De Schreye et al., Termination of Logic Programs: The Never-Ending Story, The Journal of Logic Programming, vols. 19-20, Supplement 1, May-Jul. 1994, pp. 199-260.
M P Dieben et al: "Parallel Simulation of Handshake Circuits." Feb. 26, 1994 (Feb. 26, 1994), XP055143422, Eindhoven University of Technology. 70 pages. Retrieved from the Internet: URL: http://alexandria.tue.nljextra1/afstversljwsk-i/dieben1994.pdf [retrieved on Sep. 30, 2014].
International Search Report and Written Opinion for Application No. PCT/US2018/033112, dated Aug. 31, 2018. 14 pages.
Cardelli, Luca and Wegner, Peter, On Understanding Types, Data Abstraction, and Polymorphism, Computing Surveys, vol. 17, No. 4, Dec. 1985, pp. 471-522.
Agesen, Ole, Constraint-Based Type Inference and Parametric Polymorphism,In First International Static Analysis Symposium, SAS'94, Springer-Verlag LNCS 864, 23 pages.
International Search Report and Witten Opinion for Application No. PCT/US2018/033152, dated Aug. 31, 2018. 14 pages.
Salib, Michael, "Faster Than C: Static Type Inference with Starkiller", PyCon Proceedings, Mar. 2004, 28 pages.
Office Action for Taiwanese Patent Application No. 107116385 dated Mar. 21, 2019.
Office Action for Taiwanese Patent Application No. 107116380 dated Mar. 19, 2019, Issuance date Mar. 15, 2019, dated Mar. 19, 2019.

* cited by examiner

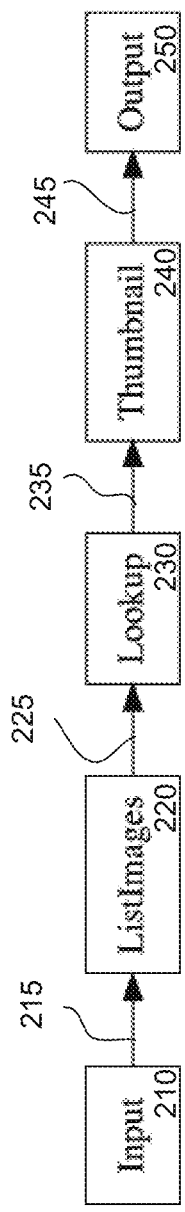
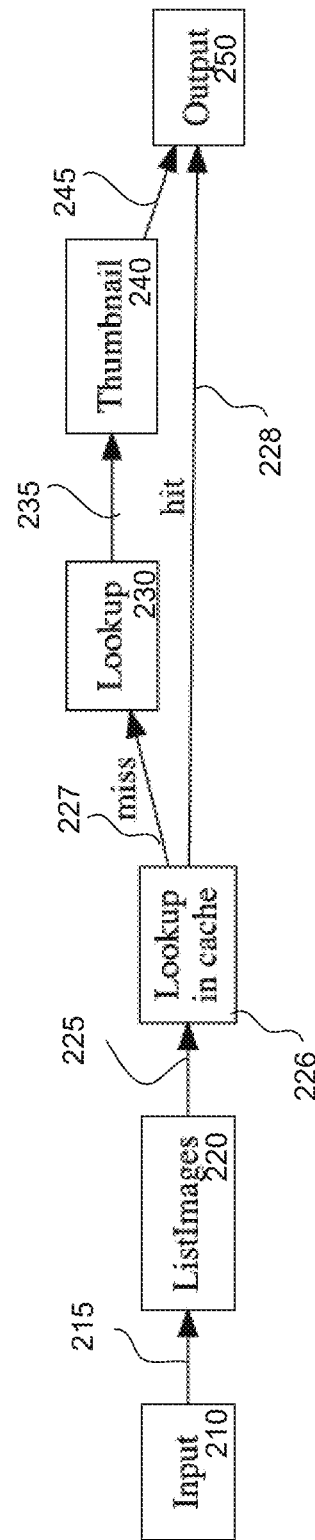
Fig. 2A
Fig. 2B

| Name | Description |
|---|---|
| Interleave | Mixes input streams into one output stream (unspecified order) |
| Project | Emits a subset of input fields |
| Rename | Renames field names |
| ArgMax | Emits the tuple with the max value (possibly grouped by some field(s)) |
| TopN | Emits top n tuples based on comparison_field |
| BottomN | Emits bottom n tuples based on comparison field |
| First | Emits the first n tuples |
| Select | Select tuples that match a particular value |
| Drop | Drop tuples that match a particular value |

Fig. 3

| Op | Output type annotation | Explanation |
|---|---|---|
| Result | | No output |
| Send | | " |
| Check | | " |
| Arg | <n:int64> | Output has specified type |
| Number | <n:int64> | " |
| Double | <n:int64> | " |
| Sum | <n:int64> | " |
| Project | <result:int64> | " |
| Eval | <result:int64> | " |
| Const | <host:bytes, port:int64> | " |
| KG.Pred | <id:int64> | " |
| ArgMax | + | Output type == Input type |
| Select | + | " |
| VLog | + | " |
| ZipAny | + | Output type == union of input types |
| ZipConst | +<pred:int64> | Add fields to input type |
| Map | +<value:int64, found:int64> | " |
| KG.Edges | +<v1:int64, v2:int64> | " |
| KG.InNodes | +<peer:int64> | " |
| KG.OutNodes | +<peer:int64> | " |
| Receive | special | " |
| Interleave | special | " |

```
Executing one or more operations
by one or more first shards
2510
```
↓
```
Sending tuples based on the
executed operations from the first
shards to a second shard
2520
```
↓
```
When sending the tuples is
complete, send a token value from
the first shards to the second shard
2530
```
↓
```
Determine by the second shard
whether a sum of the token values
matches a number of the first
shards
2540
```
↓
```
Taking an action in response to
determining that the sum of the
token values matches the number
of first shards
2550
```

Fig. 25

METHOD FOR INTRA-SUBGRAPH OPTIMIZATION IN TUPLE GRAPH PROGRAMS

BACKGROUND

Cloud computing allows users with various computing capabilities to store and process data using shared pools of configurable resources for cost and computing efficiency. Current programming models for cloud computing include MapReduce, Dryad, and Bulk Synchronous Parallel cloud processing. One of the problems facing distributed computations is performance. Performance in a distributed computation is related to a proximity of data to the computation units and data transfer costs between computation units.

BRIEF SUMMARY

The present disclosure describes a new programming model for cloud computing. The new programming model may be used for writing distributed low-latency non-batch programs. An application constructs a program under the model, and then submits it for execution. The program consists of a directed acyclic graph of operators. Streams of values flow along edges in the graph from one operator to another. Each value sent through a stream is a tuple. Different operators in the same program may run on different machines. The programming model coordinates the execution of these operators on different machines and propagates data from one operator to another.

One aspect of the programming model provides a method, comprising generating a graph for a program, the graph including a plurality of nodes and edges, wherein each node of the graph represents an operation and edges between the nodes represent streams of data input to and output from the operations represented by the nodes. The method includes determining, with one or more processors, where in a distributed architecture to execute the operations represented by the nodes. Such determining may include determining which nodes have location restrictions, assigning locations to each node having a location restriction based on the restriction, and partitioning the graph into a plurality of subgraphs, the partitioning including assigning locations to nodes without location restrictions in accordance with a first set of constraints, wherein each node within a particular subgraph is assigned to the same location. Determining which nodes have location restrictions may further include identifying requirements of the operation represented by the node and determining which locations are capable of executing the operation in accordance with the requirements. In other examples, some nodes may have predefined locations. The partitioning may include reducing a number of sub-graphs with operations assigned to a particular location. Alternatively or additionally, the partitioning may include detecting a possibility of creating a cycle among subgraphs and eliminating the cycle by further partitioning the sub-graphs. Each of the subgraphs is executed at its assigned location in a respective single thread.

Another aspect provides a method for determining distribution of operations among computing devices, including determining, with one more computing devices, which operations have predefined locations, and creating one or more sub-graphs including each of the operations identified as having assigned locations. Operations which do not have assigned locations are incorporated into the one or more subgraphs. The sub-graphs are partitioned in a first main phase, wherein each resulting sub-graph is assigned to a separate location, and each of the resulting sub-graphs is partitioned in a second local phase. The first main phase may include merging sharded sub-graphs, adding neighboring unassigned nodes into sharded subgraphs, assigning locations to all unassigned operations by copying locations from assigned nodes to their neighbors, and merging together all possible pairs of unsharded sub-graphs that run at a same location. The second local phase may include identifying sub-graphs that need to be split, preparing the identified sub-graphs for splitting, building a merge graph where each operation ends up in a separate sub-graph, and repeatedly merging the separate sub-graphs together.

Another aspect provides a method for determining distribution of operations among computing devices, comprising creating a directed graph wherein each node represents an operation of a program and each edge represents a data communication stream between operations represented by respective nodes, determining, with one more computing devices, which operations have predefined locations, creating one or more sub-graphs including each of the operations identified as having assigned locations, and automatically incorporating, by the one or more computing devices, operations which do not have assigned locations into the one or more subgraphs. The incorporating may include merging sharded sub-graphs, adding neighboring unassigned nodes into sharded subgraphs, assigning locations to all unassigned operations by copying locations from assigned nodes to their neighbors, and merging together all possible pairs of unsharded sub-graphs that run at a same location. This method may further include applying a first set of one or more constraints to the incorporating the operations which do not have assigned locations. Such first set of constraints may require all operations to be placed into the one or more sub-graphs, and a location to be assigned to each sub-graph, an operation with a predefined location retains that assignment, an unassigned operation may only be placed into a sharded location if it has a splittable property, if a location is sharded, all edges whose destination operation is assigned to that location remain unchanged throughout the algorithm, and/or the graph is acyclic. The method may further include performing local partitioning on each of the subgraphs, the local partitioning comprising identifying sub-graphs that need to be split, preparing the identified sub-graphs for splitting, building a merge graph where each operation ends up in a separate sub-graph, and/or repeatedly merging the separate sub-graphs together. The local partitioning may be performed in accordance with a second set of one or more constraints, the second set of constraints requiring at least one of each blocking operation must end up in a sub-graph of its own, only one sub-graph can have non-local inputs, or sub-graphs and edges between the sub-graphs must be acyclic.

BRIEF DESCRIPTION OF THE DRAWINGS

FIGS. 2A-2B illustrate an example of a program created using the programming model according to aspects of the disclosure.

FIG. 3 is a chart listing examples of built-in operations of the programming model according to aspects of the disclosure.

FIG. 4 is a chart listing examples of output type annotations for operations according to aspects of the disclosure.

FIG. 25 provides a flow diagram illustrating an example method 2500 for executing a program over a distributed network.

DETAILED DESCRIPTION

I. Overview

Figure 1:
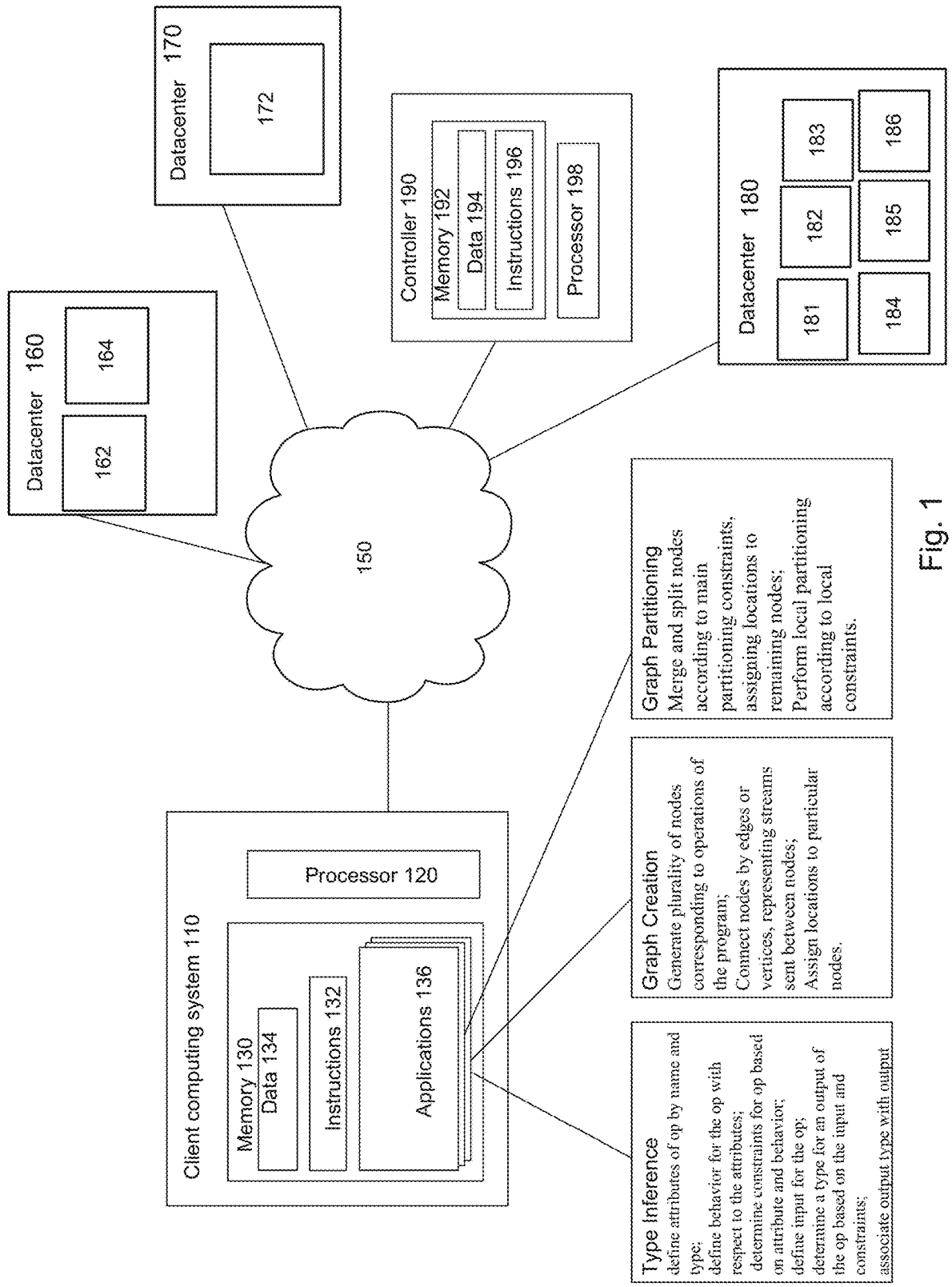
FIG. 1 is a block diagram of an example system according to aspects of the disclosure.

A new programming model may be used for writing distributed low-latency non-batch programs. An application constructs a program under the new model, and then submits it for execution. The program consists of a directed acyclic graph of operators. Streams of values flow along edges in the graph. Each value sent through a stream is a tuple. Different operators in the same program may run on different machines. The programming model coordinates the execution of these operators on different machines and propagates data from one operator to another.

Construction of the program includes defining operations that form nodes of the graph. Operations receive streams of values as input and send streams of values as output. Each stream has a tuple type, and all tuples flowing through the stream must match that type. The tuple types are defined by fields including a name identifier and a field type identifier. In defining the operations, type inference is used to provide a standardized way for the operations to interact with each other. For example, an operation, as part of its definition, can refer to its inputs and outputs and set a variety of constraints on them. One example of such a constraint is that an output type can be constrained to include every field of the input.

Operations in the graph may be performed at various locations in the distributed architecture. While some operator locations may be defined in a programming phase, others may not, and operators may be automatically assigned to other locations during graph creation and partitioning. In this regard, locations are automatically assigned in a way that reduces overall network traffic.

The graph is created based on the operations defined in the programming phase. Partitioning of the graph may be performed in two phases, including a main phase and a local phase. Each phase is carried out in accordance with a set of constraints. A first set of constraints for the main partitioning may be different than a second set of constraints for the local partitioning.

In the main phase, a first step merges sub-graphs in accordance with the first set of constraints, minimizing a total number of sub-graphs in the program. Some sub-graphs are then grown by incorporating neighboring unassigned nodes into them. Candidate operations are first checked to determine whether they have been marked as splittable, meaning they can be split into separate operations without changing the functionality of the operation. If not, they are not incorporated into the neighboring sub-graph. If they are splittable, placing those candidates into the neighboring sub-graphs is limited by the constraints. Locations are assigned to all unassigned operations by copying locations from assigned nodes to their neighbors. Possible pairs of unsharded sub-graphs that run at the same location are merged to minimize the total number of sub-graphs. At some point, further merging will not be possible.

In the local partitioning phase, sub-graphs that need to be split, for example to prevent inefficiencies in execution, are identified. These sub-graphs can simply be those containing blocking operations, which might hold onto a thread while performing I/O, preventing further operations from being able to run. The graph is prepared for splitting. This may include modifying the sub-graph to enforce the local partitioning constraints. A merge graph is built where each operation ends up in a sub-graph of its own. These sub-graphs are then repeatedly merged together. Specifically, all operations having external incoming edges are merged together into the same sub-graph. Further, all possible pairs of sub-graphs that have nonblocking operations are merged.

The new programming model automatically shards computations by instantiating sub-graphs multiple times, if an operator is implemented for a sharded service. The sharding provides both a latency benefit in that the shards are executed in parallel, as well as a data efficiency benefit. As an example of the data efficiency benefit, operators placed after a sharded operator can often run on the same sharded instances, filtering and reducing the eventual output so network traffic is minimized.

Once partitioned, the graph may be executed. Each of the sub-graphs is executed at their respective locations, and each sub-graph is executed in a respective single thread. Data transfers along edges within a sub-graph are optimized based on their execution within a single-threaded environment.

Various aspects of the programming model allow for efficient execution of the programs. Such aspects include, by way of example and not limitation, pipelining and the sharding described above. The pipelining provides for very low latency. For example, for a computation consisting of a series of 5 operations that take 10 ms each, but involve hundreds of thousands of independent values, processing the operations one after the other would take 50 ms. However, a properly pipelined solution could be completed in as little as 10 ms. In order to accomplish this, tuples are streamed between operators during execution, which leads to better pipelining across the overall program. This tuple streaming format provides efficient serialization/deserialization across the network due. In order to get the pipeline started early but achieve higher throughput, the new programming model uses dynamic buffer growth. For example, small messages are sent early on in the computation, but grow later on because larger messages are more efficient.

The new programming model also provides for low buffering, for example, by instituting flow control between network nodes. For example, sending nodes determine if a receiver is busy, and if so block transmission. Within a sub-graph, the new programming model is able to efficiently deliver data between operations via local procedure calls. The new programming model efficiently determines when a computation completes, and by determining completion sooner, provides for lower latency.

II. Example Systems

FIG. 1 illustrates an example system including a distributed computing environment. A plurality of datacenters 160, 170, 180 may be communicatively coupled, for example, over a network 150. The datacenters 160, 170, 180 may further communicate with one or more client devices, such as client 110, over the network 150. Thus, for example, the client 110 may execute operations in "the cloud." In some examples, the datacenters 160, 170, 180 may further communicate with a controller 190.

Client 110 may execute one or more applications for creating programs using the new programming model. Each client 110 may be a personal computer, intended for use by a person having all the internal components normally found in a personal computer such as a central processing unit (CPU), CD-ROM, hard drive, and a display device, for example, a monitor having a screen, a projector, a touch-screen, a small LCD screen, a television, or another device such as an electrical device that can be operable to display information processed by processor 120, speakers, a modem and/or network interface device, user input, such as a mouse, keyboard, touch screen or microphone, and all of the components used for connecting these elements to one another. Moreover, computers in accordance with the systems and methods described herein may include devices capable of processing instructions and transmitting data to and from humans and other computers including general purpose computers, PDAs, tablets, mobile phones, smartwatches, network computers lacking local storage capability, set top boxes for televisions, and other networked devices.

The client 110 may contain a processor 120, memory 130, and other components typically present in general purpose computers. The memory 130 can store information accessible by the processor 120, including instructions 132 that can be executed by the processor 120. Memory can also include data 134 that can be retrieved, manipulated or stored by the processor 120. The memory 130 may be a type of non-transitory computer readable medium capable of storing information accessible by the processor 120, such as a hard-drive, solid state drive, tape drive, optical storage, memory card, ROM, RAM, DVD, CD-ROM, write-capable, and read-only memories. The processor 120 can be a well-known processor or other lesser-known types of processors. Alternatively, the processor 120 can be a dedicated controller such as an ASIC.

The instructions 132 can be a set of instructions executed directly, such as machine code, or indirectly, such as scripts, by the processor 120. In this regard, the terms "instructions," "steps" and "programs" can be used interchangeably herein. The instructions 132 can be stored in object code format for direct processing by the processor 120, or other types of computer language including scripts or collections of independent source code modules that are interpreted on demand or compiled in advance.

The data 134 can be retrieved, stored or modified by the processor 120 in accordance with the instructions 132. For instance, although the system and method is not limited by a particular data structure, the data 134 can be stored in computer registers, in a relational database as a table having a plurality of different fields and records, or XML documents. The data 134 can also be formatted in a computer-readable format such as, but not limited to, binary values, ASCII or Unicode. Moreover, the data 134 can include information sufficient to identify relevant information, such as numbers, descriptive text, proprietary codes, pointers, references to data stored in other memories, including other network locations, or information that is used by a function to calculate relevant data.

Applications 136 may be used for constructing programs under the new programming mode. The applications 136 may, for example, be downloaded, executable from the instructions 132, or remotely accessed. In some examples, the application may be remotely executed. For example, client 110 may compile a program and send it to the cloud for execution. The applications 136 may perform different functions, such as type inference, graph creation, graph partitioning, etc. For example, one application may perform a variety of different functions, or various applications may each perform one or more different functions.

For the type inference function, the application may be configured to receive information defining attributes of an operation by field name and type specifier. The application may further receive information defining a behavior for the operation with respect to the attributes. Constraints for the operation are determined based on the attribute and behavior. Information defining an input for the operation may also be received, and used along with the constraints to determine a type for an output of the operation. The determined output type may be associated with the output for the operation.

For graph creation, a plurality of nodes may be generated, wherein each node corresponds to an operation of the program. The nodes are connected be edges or vertices, representing streams sent between nodes. Locations may be assigned to particular nodes, for example, automatically based on program requirements and capabilities of computing devices, or manually by programmer selection.

For graph partitioning, the graph is optimized to reduce overall network traffic. For example, where possible, locations for execution of one or more operations are automatically assigned together. In doing so, nodes are merged and split according to a number of predefined constraints. Partitioning may further be performed at a local level, for example, for operations to be executed at a sharded location. Such local partitioning may be performed according to a second, separate set of constraints. Both main and local partitioning may be performed when the program is compiled. As a result of the partitioning, the program is ready for execution by computing devices in one or more datacenters 160, 170, 180, and may be send for execution.

Although FIG. 1 functionally illustrates the processor 120 and memory 130 as being within the same block, the processor 120 and memory 130 may actually include multiple processors and memories that may or may not be stored within the same physical housing. For example, some of the instructions 132 and data 134 can be stored on a removable CD-ROM and others within a read-only computer chip. Some or all of the instructions and data can be stored in a location physically remote from, yet still accessible by, the processor 120. Similarly, the processor 120 can actually include a collection of processors, which may or may not operate in parallel.

The datacenters 160-180 may be positioned a considerable distance from one another. For example, the datacenters may be positioned in various countries around the world. Each datacenter 160, 170, 180 may include one or more computing devices, such as processors, servers, shards, or the like. For example, as shown in FIG. 1, datacenter 160 includes computing devices 162, 164, datacenter 170 includes computing device 172, and datacenter 180 includes computing devices 181-186. Programs may be executed across these computing devices, for example, such that some operations are executed by one or more computing devices of a first datacenter while other operations are performed by one or more computing devices of a second datacenter. In some examples, the computing devices in the various datacenters may have different capacities. For example, the different computing devices may have different processing speeds, workloads, etc. While only a few of these computing devices are shown, it should be understood that each datacenter 160, 170, 180 may include any number of computing devices, and that the number of computing devices in a first datacenter may differ from a number of computing devices in a second datacenter. Moreover, it should be understood that the number of computing devices in each datacenter 160-180 may vary over time, for example, as hardware is removed, replaced, upgraded, or expanded.

In some examples, each datacenter 160-180 may also include a number of storage devices (not shown), such as hard drives, random access memory, disks, disk arrays, tape drives, or any other types of storage devices. The datacenters 162, 172, 182 may implement any of a number of architectures and technologies, including, but not limited to, direct attached storage (DAS), network attached storage (NAS), storage area networks (SANs), fibre channel (FC), fibre channel over Ethernet (FCoE), mixed architecture networks, or the like. The datacenters may include a number of other devices in addition to the storage devices, such as cabling, routers, etc. Further, in some examples the datacenters 160-180 may be virtualized environments. Further, while only a few datacenters 160-180 are shown, numerous datacenters may be coupled over the network 150 and/or additional networks.

In some examples, the controller 190 may communicate with the computing devices in the datacenters 160-180, and may facilitate the execution of programs. For example, the controller 190 may track the capacity, status, workload, or other information of each computing device, and use such information to assign tasks. The controller 190 may also assist in determining whether streams sent over the network have completed. For example, the controller 190 may in some cases send tokens on behalf of sharded operators, the tokens used by downstream nodes to determine that the stream is complete. The controller 190 may include a processor 198 and memory 192, including data 194 and instructions 196, similar to the client 110 described above.

Client 110, datacenters 160-180, and control 190 can be capable of direct and indirect communication such as over network 150. For example, using an Internet socket, a client 110 can connect to a service operating on remote servers through an Internet protocol suite. Servers can set up listening sockets that may accept an initiating connection for sending and receiving information. The network 150, and intervening nodes, may include various configurations and protocols including the Internet, World Wide Web, intranets, virtual private networks, wide area networks, local networks, private networks using communication protocols proprietary to one or more companies, Ethernet, WiFi (e.g., 702.71, 702.71b, g, n, or other such standards), and HTTP, and various combinations of the foregoing. Such communication may be facilitated by a device capable of transmitting data to and from other computers, such as modems (e.g., dial-up, cable or fiber optic) and wireless interfaces.

III. Constructing a Program

FIGS. 2A-2B illustrate an example of a program created using the programming model. In this program, an objective is to fetch all images in a photo album and generate a thumbnail for each image. In code, this objective may be represented as:

```
thumbnails = []
for image_name in images(album_name):
    image = lookup(image_name)
    thumb = thumbnail(image)
    thumbnails.append(thumb)
return thumbnails
```

However, if album data is stored on a different server, the images(album_name) call requires a remote access. The lookup calls should be sent in parallel to a sharded service that returns the image data given an image name. The thumbnail calls should be sent in parallel to a separate bank of thumbnailing servers. A program constructed and executed in accordance with the programming model described herein achieves this distributed execution in the following way:

```
// The input and output
string album_name = ...;
vector<string> thumbnails;
// Construct the program
Program program;
Stream input = program.AddInput(album_name);
Stream image_names = ListImages(input);
Stream images = Lookup(image_names);
Stream result = Thumbnail(images);
program.AddOutput(result, &thumbnails);
// Run the program
util::Status s = runtime.Run(program);
```

This program construction produces the graph of FIG. 2A. As shown, input operation 210 produces a stream 215 that feeds an album name to ListImages operation 220. ListImages 220 has associated metadata that tells the programming model that it must run on a different server, perhaps a particular shard based on the album name. The programming model internally creates a remote procedure call (RPC) to the appropriate shard of this service and sends it the album name. ListImages 220 produces a stream 225 of image names. The programming model again finds the appropriate shard of Lookup service for each image name and sends the names to these shards. The Lookup operator 230 generates a stream 235 of images. These images in turn are passed to yet another service, Thumbnail operation 240, that generates thumbnails. The programming model finds the appropriate shard of the Thumbnail service for each image, and sends each image to the appropriate shard. The generated thumbnails 245 are saved as Output 250 of the program. Although the computation touches servers in three different sharded services, the application code does not have to initiate or manage any remote communication.

FIG. 2B represents an updated graph, where the program is tweaked to add a cache of thumbnails keyed by image name. Accordingly, Lookup in Cache operation 226 is shown. Thumbnails of images that hit in the cache are passed directly to the output, via stream 228. The missed image names are sent to Lookup 230 as before, but via stream 227. The application is agnostic to a location or implementation of the cache. As long as the cache implements a lookup operator in accordance with the programming model, which knows the location of the cache, the program of FIG. 2B suffices.

According to some examples, the programming model may provide a set of built-in operators. Examples of such built-in operators are provided in the chart of FIG. 3. Each operator is described in connection with a corresponding function. While only a few operators are shown, it should be understood that any number of operators may be built into the programming model. Additionally, further operators may be created. Programs may be built by wiring operators together with streams, for example, according to the following code:

```
util::Status SimpleProgram(Runtime* runtime) {
    ProgramBuilder builder("guide.SimpleProgram");
    ErrorCollector err;
    const Type num_type("struct<n int64>", &err);
    if (!err.ok()) return err.status();
    Stream s1 = Const(&builder, num_type, {1});
    Stream s2 = Const(&builder, num_type, {2});
    Interleave({s1, s2});
    Compiler compiler;
    compiler.AddLibrary(plaque::BuiltinOpdef());
    Program program;
    util::Status status = compiler.Compile(builder, &program);
    if (!status.ok()) return status;
    // Program execution
    Binding binding;
    return runtime->Run(program, &binding);
}
```

This program combines two constants into a single stream. Operators are added to the graph by calling operator specific constructor function (Const and Interleave). Every operator has such a constructor function, which returns one or more streams. These streams can be used as arguments to later operator constructor functions.

In creating the program, the operators can be defined by fields including a name and a type specifier. The name may be selected by the programmer Choosing a unique name may provide the most helpful output, though it is not required.

Once the operators are wired together, the program may be built by constructing a Program object and compiling it. In addition, a Compiler object is constructed the built-in operator library is added to it. A Binding object may be constructed to supply arguments and results to the program in later stages.

Providing input to, and receiving output from, the program may be accomplished by adding Results and Args. A Result may be added with an input stream and a name for the result, and then the name of the result is associated with an actual instance. This separation allows a program to be reused with different outputs. Args may be added by a similar process, adding the Arg with a name, and associating the name with an instance, allowing the program to be used with different input data.

A. Type Inference

Each value sent through a stream is a tuple. Each stream has a tuple type and all tuples flowing in that stream must match that type. A tuple type is defined by a fixed set of fields of the form <name:field type>. An example of a tuple type is struct <city string, population int64>. This tuple has two fields: a city field that holds a string and a population field that holds a number (64-bit integer). Some values that match this type are {city:'Tokyo', population:13350000} and {city:'Ithaca', population:30515}. Examples of field types that may be supported in a tuple include, but are not limited to: bool, bytes, string (bytes required to be valid UTF-8), double, float, int32, uint32, int64, and uint64.

To allow for operations to be implemented in a way that is applicable across various platforms and programming languages, an inferencing algorithm allows for inputs to operations to change or parameterize the field names, field types, or shape of structs. To allow for distributed graph execution, the specification of type inferencing rules and constraints is separate from the actual implementation of operators. As such, the flow of types is expressed through operations, without a need to determine particular implementations.

An operation, as part of its definition, can refer to its inputs and outputs, and can set a variety of constraints on them. An output can be constrained in terms of the input. For example, an output type can be constrained to include every field of the input. It can also be constrained to include one or more additional fields, in addition to every field of the input. As another example, the output type could simply be constrained to include one or more specific fields.

An example operation is as follows:

```
op {
    name: sstable_lookup
    input:         { name: In,      type: InType }
    sharding_field: { input: In,    field: fp_field}
    output:        { name: Hits,    type: HitType }
    output:        { name: Misses,  type: InType }
    attribute:     { name: key_field, type: bytes }
    attribute:     { name: val_field, type: bytes }
    attribute:     { name: fp_field, type: bytes }
    constraint:    { name: InType,   contains:struct<key_field bytes, fp_field uint64> }
```

```
        constraint:  { name: HitType,   concat: [InType,struct<val_field bytes>]}
        properties: {
            end_when_outputs_done: true
            skip_on_empty_inputs: true
        }
}
```

In this example, the operation is parameterized by attributes defined by field names key_field, fp_field, and val_field. A programmer can specify these field names when creating the operation, and the operation's behavior is configured by reference to these field names. That behavior determines the type constraints. For example, the type constraints may specify that an input to the operation should contain the fields <key: bytes> (name: key, type: bytes) and <fp: uint64>, and that the output value should contain the field <val: bytes>.

The example operation may also specify other properties, such as a number of input streams, a number of output streams, how sharding should be implemented, etc. For example, the operation in the example above also specifies that fp_field is used for sharding purposes. By way of example only, the operation could be spread across 100 replicas, and if evenly distributed each replica would receive 1% of the input. The fp_field is consulted in order to determine which shard should receive the input data via modular arithmetic.

The operation defines that it receives a single input stream named In, and creates two output streams named Hits and Misses. Misses are defined to have the same type as the input, while Hits is constrained to be a new type consisting of a concatenation of the input type and <val_field bytes>. Operations may have other properties that are not used for type inference purposes, but are important for graph execution purposes. Examples of such other properties in the example operation above include end_when_outputs_done and skip_on_empty_inputs.

The types of all the operations are determined at compile time and checked for correctness. For example, it is determined at compile time whether the outputs of one operation are matched with the inputs of another operation. The system performs type inference to turn type constraints into concrete types. This may be implemented as a forward pass.

Operator constructor functions, mentioned above, return a stream object. For example:

Stream s=ZipConst(input, {"label", 100});

The operator constructor function is used to add type-related information to a statement associated with the stream it returns. Following the example above, ZipConst may add type-related information such as +<label:int64>. In this example annotation, the "+" indicates that all fields in the input type should be added to the output type. The "<label: int64>" indicates that a 64 integer field named "label" should also be added to the output type. "<label:int64>" may be referred to as type specifier, which may more generally specify a sequence of field name, field type pairs. Type inferencing code of the programming model interprets these annotations and generates an output type. The inference may produce an error in some instances, such as if a programmer attempts to define an output that is inconsistent with the constraints. For example, if the input type already contains a field named "label", the type inference will fail because each field name can occur once in a valid type. When such an error occurs, the output definition attempted may be rejected, and the programmer may be prompted to enter a different definition that is consistent with the constraints. In other examples, the attempted output definition producing the error may be automatically flagged by the programming model for further review by the programmer.

FIG. 4 provides a chart listing examples of output type annotations for existing operators. It should be understood that the chart is not exhaustive, and that other example output type annotations may also be used in the programming model.

Some operators, such as Receive and Interleave, are marked as "special". Type inference provides special treatment for these operators. For example, for Receive, the output type is identical to the input type for a sending node associated with the annotation. For Interleave, all input types are identical, and the output type is the same as the input type. While this may inhibit writing operators that do very complicated processing of types, they are beneficial in that they provide for greater consistency among operators. Moreover, if the type inference code does not need to run any operator specific code, it can run in a place where the operator implementation is not available. For example, in a distributed setting, type inference may be performed at the controller without requiring all operator to be linked to the controller. The type inference may be performed as a forward pass.

The programming model may further provide for type checking. Operator constructor functions may add an annotation to a statement, wherein the annotation is used for type-checking inputs to the operator. For example, operator Sum requires that an input contain a numeric field, and this place the following input type annotation on its statement: <n:int64>. The programming model will verify that any input fed into this operator contains a superset of the specified fields.

Figure 5:
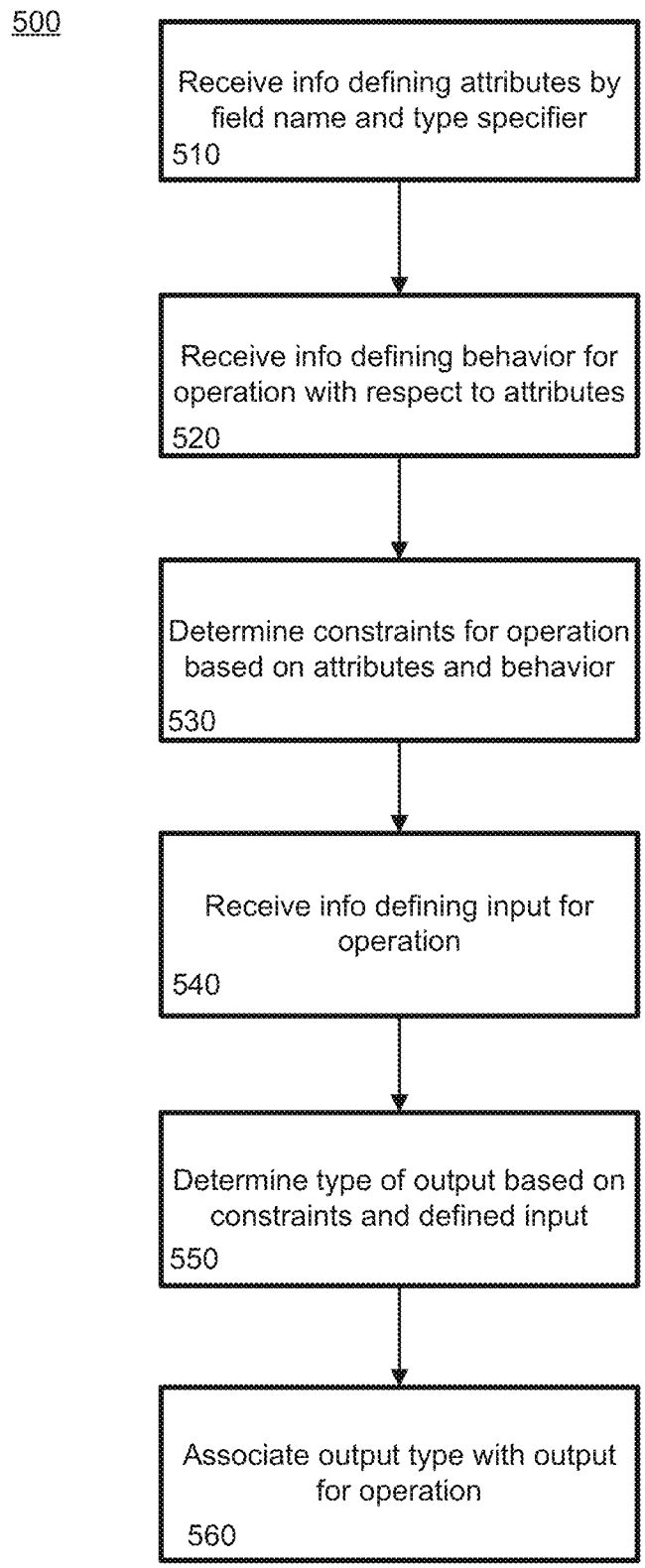
FIG. 5 provides a flow diagram illustrating an example type inferencing method according to aspects of the disclosure.

FIG. 5 provides a flow diagram illustrating an example type inferencing method 500. The method may be performed by, for example, a client computing device, controller, or other network computing device. While the method is described below in a particular order, it should be understood that subparts may be performed in a different order or simultaneously. Moreover, subparts may be added or removed.

In block 510, information is received defining attributes by field name and field type identifier. For example, referring to the example operation produced in code above, attributes {key_field, bytes}, {val_field, bytes}, and {fp_field, bytes} are defined. This information is used to define types of input and output streams of the operation.

In block 520, information is received defining a behavior for an operation with references to the attributes. For example, referring to the example above, the input, output, and sharding fields determine how the operation will behave.

In block 530, constraints are determined for the operation based on the attributes and the behavior. The constraints may in some examples be automatically determined by the programming model. In other examples, the constraints may be defined by a user.

In block 540, information defining an input for the operation is received. The input may include, for example, a field including a name and a type. This information may also be referred to as type information and is provided for one or more input streams of the operations. The type inference method determines type information for one or more output streams of an operator based on based on type information associated with one or more input streams and an output annotation associated with the operator. Type information may include constraints that restrict the tuples included in the stream with which the type information is associated. The type should correspond to a type defined in the attributes.

In block 550, an output type is determined based on the constraints and the defined input. For example, the output type may be limited to a type specified in the constraints, and may correspond to the received information defining the input. Such determining may be performed in a forward pass through the graph, without backtracking.

In block 560, the output type is associated with an output for the operation. For example, when the user is defining an output for the operation, the output type field may be automatically populated. In other examples, attempts by the user to enter a different output type may be prohibited.

While the foregoing examples describe determining an output type based on an input type and defined operators, type inference may also be used in the converse. For example, the output type may be received as input, and the input type may be determined based on the defined output type and other information.

Type inference and verification of constraints as described above ensure accurate and fast query execution. Operations can also be implemented in a very generic way. The inferencing allows for inputs to operations, such as attributes, to change or parameterize the field names, field types or even the shape of structs. To allow for distributed graph execution, the specification of type inferencing rules and constraints is separate from the actual implementation of operators. The result is a format which is entirely abstracted away from any particular implementation while expressing the flow of types through the operations. Type inference and constraints verification are part of a critical path of query execution, leading to the requirement of fast execution. A single pass inference and verification algorithm without backtracking further provides for fast execution.

B. Location Assignment

Location assignment happens during program construction. Operations in a graph may have a location restriction, indicating one or more locations where the operation may be executed. The location restriction may be defined by a user, or may be determined based on capabilities of computing devices in the distributed system. For example, if data to be retrieved by a lookup operation is stored in a particular datacenter, then the lookup operation is limited to being performed at the particular datacenter.

For operations without a location restriction, the programming model assigns a location to the operation. These locations may be selected to optimize the computation in some way. For example, one node may generate a substantial amount of data but then be followed by a filter node which filters out 99% of the data. In this case, it is particularly advantageous to locate the filter node at the same location of the data generating node. Location assignment may occur as part of graph creation and partitioning, discussed further below.

i. Graph Construction

Figure 6A:
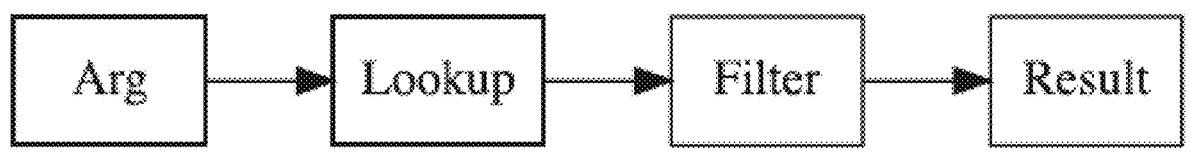
FIGS. 6A-6C illustrate an example of location assignment during program creation according to aspects of the disclosure.
Figure 6B:
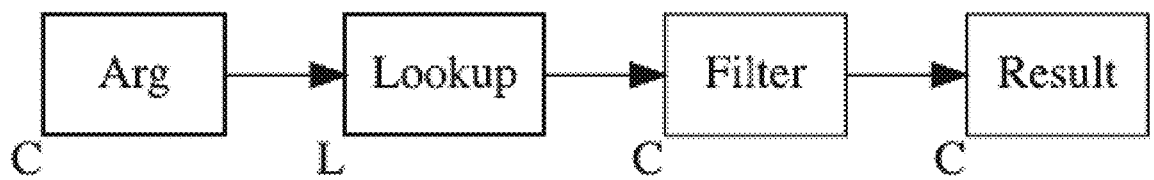
Figure 6C:
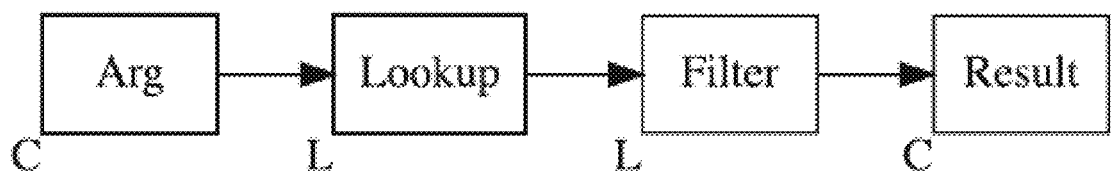

FIGS. 6A-6C illustrate an example of location assignment during program construction. FIG. 6A provides an example graph, with nodes representing operations and edges between the nodes connecting a source operation and a destination operation, wherein the output of a source operation is the input of the destination operation. In this program, arguments 610, such as keys, are send to a remote location, where a lookup 620 is performed. The lookup results are sent through a filter 630, which removes some results and output them into result operation 640.

FIG. 6B illustrates an example of user-assigned locations for each of the operations. Arguments 610 are sent from location C to location L for Lookup 620. The results of the Lookup 620 are then sent back to location C for filtering and outputting the result. This results in sending a large amount of data from location L to location C, only to have much of that data filtered by the filtering operation 630. FIG. 6C illustrates a more efficient example of possible user-assigned locations, where the lookup and filtering are both performed at the same location L. Such assignment optimized execution time and reduces network traffic. However, relying on the user to foresee potential inefficiencies in location assignment and accommodate for them places a significant burden on the user.

Figure 7A:
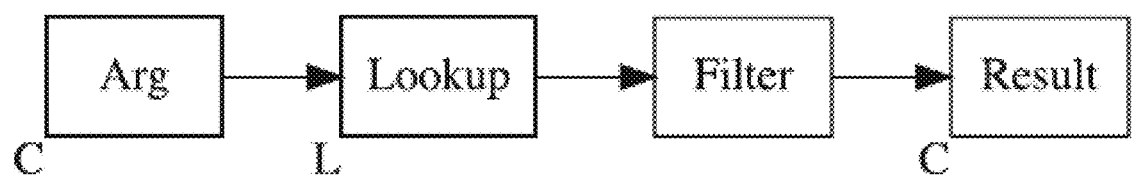
FIGS. 7A-7B illustrate an example of automatic location assignment during graph creation according to aspects of the disclosure.
Figure 7B:
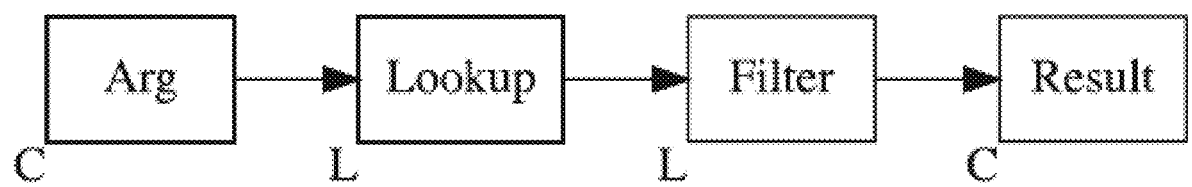

FIGS. 7A-7B illustrate an example of automatic location assignment during graph creation. When the program is constructed, operations Arg 710, Lookup 720, and Result 740 come with pre-assigned locations. These locations may be automatically pre-assigned by the programming model, for example, based on capabilities of the computing devices for executing the operations, limitations associated with the operation definitions, or any other information. The Filter operation 730 comes with no location assignment. Accordingly, when the graph is created, it may be appear as shown in FIG. 7A. When the program is submitted for execution, the programming model will recognize that Filter 730 is a data-reducing operation, and assign it to location L. Accordingly, the program would appear as in FIG. 7B.

Because the location assignment is automated, partitioning the program into graphs preserving the location constraints should also be automated. This partitioning is done in a way that maximizes performance.

Figure 8A:
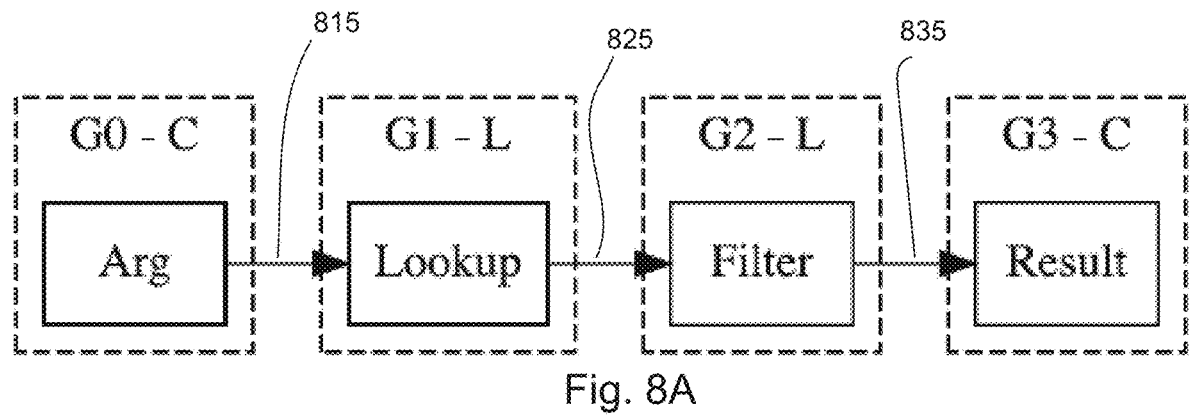
FIGS. 8A-8C illustrate an example of partitioning a graph to minimize a number of sub-graphs according to aspects of the disclosure.
Figure 8B:
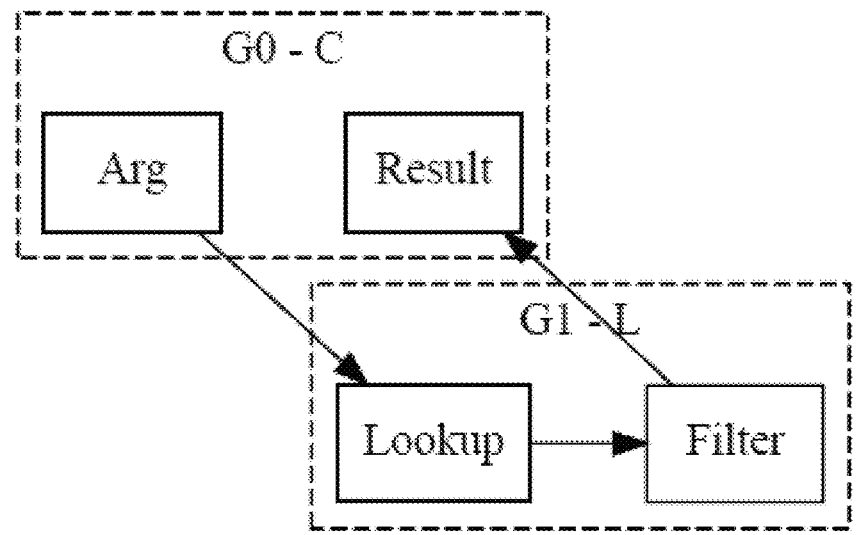
Figure 8C:
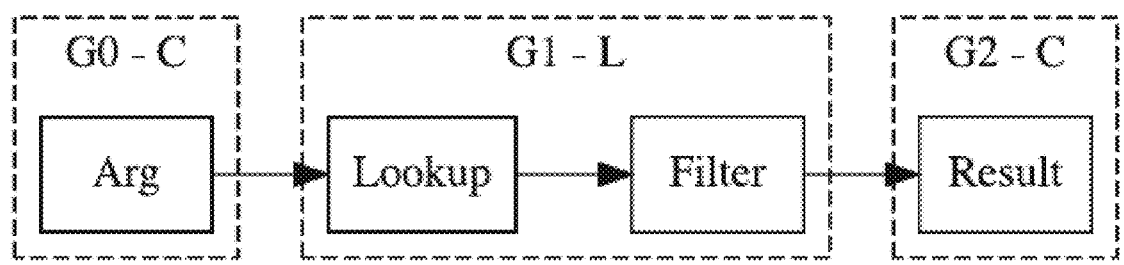

FIGS. 8A-8C illustrate an example of partitioning a graph to minimize a number of sub-graphs, while adhering to constraints. For example, the graph must remain acyclic. As shown in FIG. 8A, every operation runs in a separate graph G0, G1, G2, G3. As such, data needs to be serialized and de-serialized on every edge 815, 825, 835. For edges 815 and 835, which span across the two locations C and L, such data serialization is needed for network transfer. However, the data-serialization is not needed for edge 825. Minimizing the number of graph partitions, however, would result in the graph of FIG. 8B, which introduces a cycle between graphs G0-G1, and G1-G0. This may lead to deadlocks, and thus should be avoided. Minimizing the number of graphs while forbidding cycles results in the graph of FIG. 8C, which is optimal partitioning for the program.

Figure 9A:
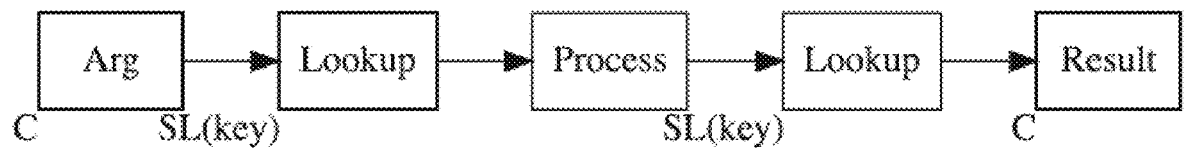
FIGS. 9A-9D provide an example of graph partitioning for sharded locations according to aspects of the disclosure.
Figure 9B:
Figure 9C:
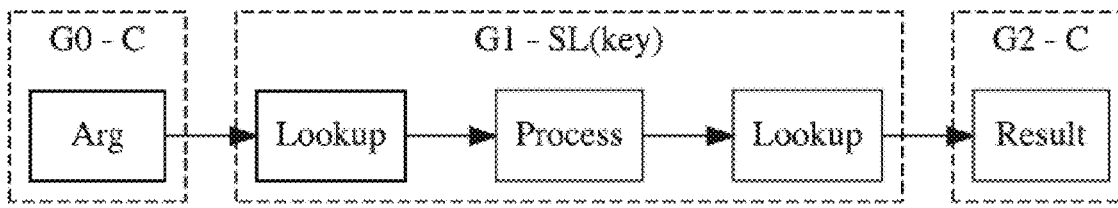
Figure 9D:
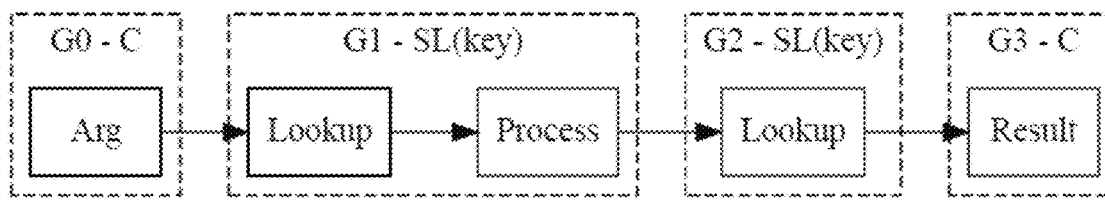

Sharded locations present additional considerations for graph partitioning. FIGS. 9A-9D provide an example of graph partitioning for sharded locations. Sharded locations may include any location having multiple computing shards for executing operations. As shown in FIG. 9A, two Lookup operations 920, 940 are placed on the same location, sharded by the field "key". Assigning Process operation 930 to the same sharded location produces the graph of FIG. 9B, which is likely to be partitioned as shown in FIG. 9C. However, this partitioning is incorrect. If the Process operation 930 modifies the key field in any way, its output should not be passed directly to the second Lookup operation 940 without re-sharding the input. To prevent this occurrence, all sharded locations are treated as unique. For example, even though both Lookup operations 920, 940 are assigned to the same location, they are treated as different locations. Thus, as shown in FIG. 9D, the Process operation 930 is assigned to one of the unique Lookup locations.

As demonstrated by the above examples of sharded locations, assigning the same location to two operations doesn't guarantee that they will be run together in the same graph. Two operations assigned to the same sharded location are guaranteed not to be run in the same graph. While this behavior doesn't impact program's correctness, it may impact its performance. Accordingly, the programming model provides a way for the user to co-locate a group of operations together at a particular location. Those operations are then guaranteed to end up in the same graph at that location, with other operations possibly added to it. Whenever operations are specified as co-located, data sent between them is not re-sharded.

Figure 10A:
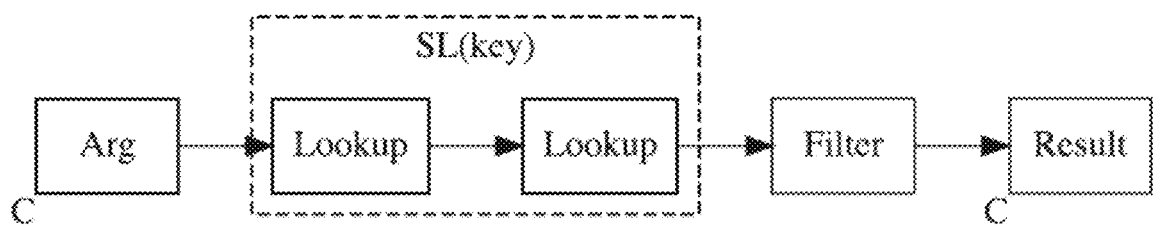
FIGS. 10A-10B provide an example of co-location according to aspects of the disclosure.
Figure 10B:
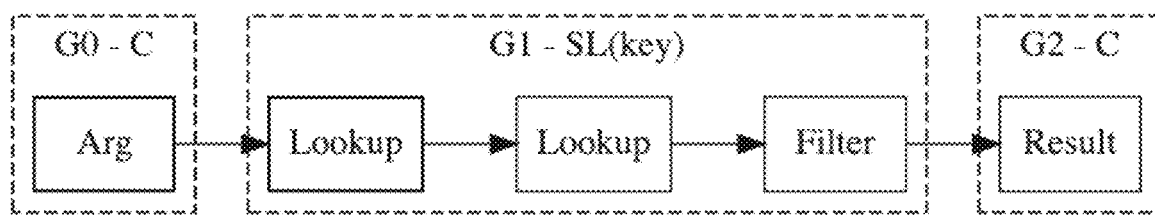

FIGS. 10A-10B provide an example of co-location. In the program of FIG. 10A, the user has specified that the Lookup operations 1020, 1030 are to be run together at a given location. After location assignment and graph creation, the program would be partitioned as shown in FIG. 10B.

To summarize the automatic location assignment and graph partitioning described above, location is a property of an operation, not a graph. Some operations will come with preassigned locations or location constraints, some will have their locations assigned by the user, and some will come with no assigned locations. The user writes a program with a single graph of operations, without worrying about sub-graphs. Each operation provides hints to the programming model. For example, for each output edge, the operation reports the percentage of total input data that will flow on that output edge. This hint helps the programming model determine what locations to assign to operators. In other examples, this information may be automatically computed for a given program, during earlier runs. The programming model automatically assigns locations to operations, and automatically partitions the program into a minimal number of graphs while preserving the property of no cycles between graphs.

According to one example, the output hints specified in operations, or data collected from preceding graph runs, may be used to augment each edge of the program graph with an expected number of tuples that will flow on that edge. Locations may therefore be assigned to graph nodes in a way that minimizes the total number of tuples that flow between locations. Such location assignment may be performed by sorting all edges in the program in decreasing tuple-count order, and iterating over edges in sorted order. For each edge, source and destination operators are identified and will be assigned the same location by grouping them together if neither has a location assigned to it. If one has a location assigned, the same location is assigned to the other operator and all other operators that may have been grouped with it. This algorithm removes the most expensive edge from the total tuples count, then the next expensive, and so on.

Figure 11A:
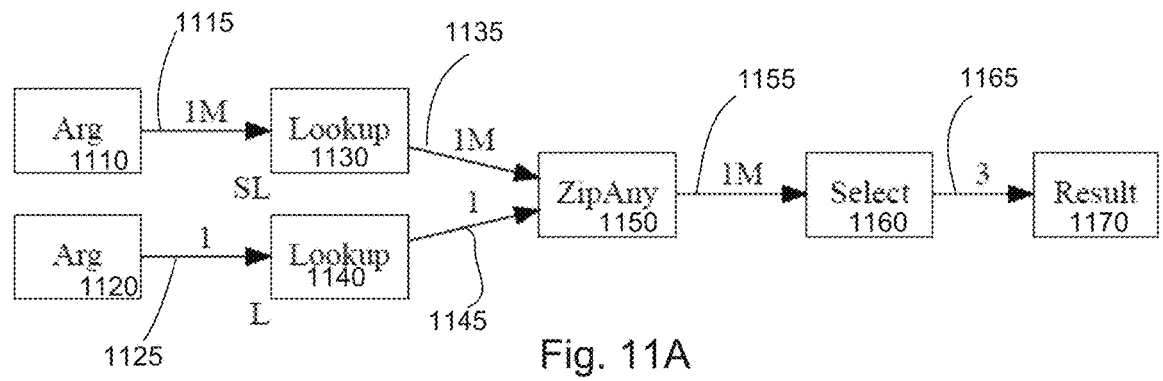
FIGS. 11A-11C illustrate an example of a program with multiple input operations according to aspects of the disclosure.
Figure 11B:
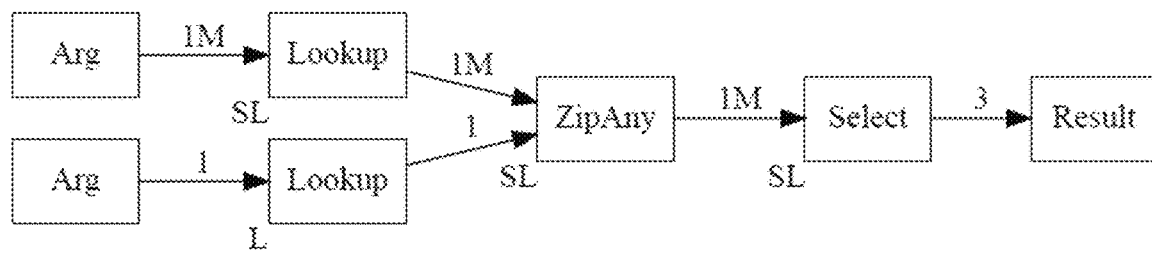
Figure 11C:
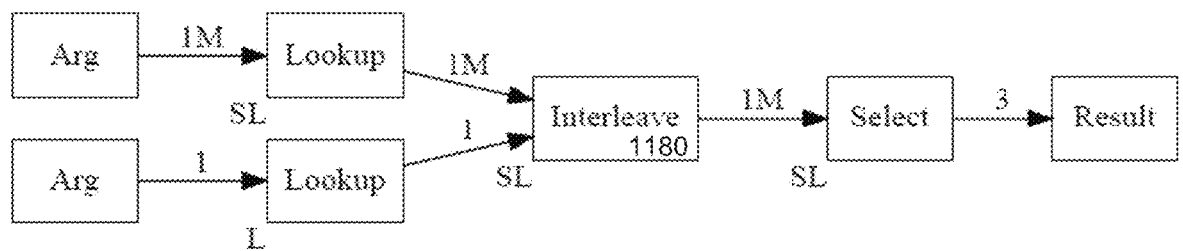

FIGS. 11A-11C illustrate an example of a program with multiple input operations. As shown in FIG. 11A, the program includes a first input argument 1110, which inputs to a first Lookup operation 1130 via edge 1115. The program also includes a second input argument 11130, which provides input to a second Lookup operation 1140 via edge 1125. The Lookup operations 1130, 1140 provide streams to ZipAny operation 1150 over edges 1135, 1145, respectively, and ZipAny operation 1150 provides streams to Select operation 1160 over edge 1155. An output is provided to Result 1170 over edge 1165. Edge weights represent the estimated number of tuples that flow along the edges. For example, edges 1115, 1135, and 1155 have edge weight of 1 M. Edges 1125 and 1145 have edge weights of 1, and edge 1165 has a weight of 3. Location SL is sharded, while location L is un-sharded.

Automatic partitioning of this program may result in the graph of FIG. 11B, where ZipAny 1150 and Select 1160 are both assigned to location SL. This location assignment would work, provided that the second Lookup operation 1140 running at location L broadcasts its tuple(s) to all sharded instances of ZipAny 1150.

As shown in FIG. 11C, the ZipAny operation is replaced with an Interleave operation 1180. The program would work, provided that the second Lookup operation 1140 running at location L sends it tuple(s) to only one of the sharded instances of Interleave. While this solution is operation specific, the problem may also be solved more generally. For example, all multiple input operations may be marked as non-splittable. An operation may be splittable if it can be split into separate operations without changing the functionality of the operation. For example, if there are three streams S1, S2, S3 that feed to an operation OP, then operation OP is splittable if OP(UNION(S1, S2, S3))==UNION(OP(S1), OP(S2), OP(S3)). An example of a splittable operation is the operator Double, mentioned in FIG. 4, which doubles every input value. This may, however, lead to performance degradation. Another example of a general solution is to require the program writer to specify explicitly how multiple input operations are to be sharded. However, this would place a burden on the program writer, and would remove the possibility of dynamic optimization of the program. Yet another example general solution is to provide a way for an operation writer to customize the splitting of multiple input operations. In the above example, ZipAny would always want its other input to be broadcast, while Interleave would always want its other input to be sent to only one location. While this places an additional burden on the operation writer, it is less significant than the potential burden on the program writer and preserves correctness of the program with optimized performance.

ii. Graph Partitioning

In addition to location assignment, the new programming model performs automatic partitioning of the graph in a way that is optimized to reduce overall network traffic and increase speed and performance in executing the programs. The operations in the graph are partitioned into a plurality of sub-graphs. Every operation in a sub-graph must be assigned to the same location. In performing the partitioning, a possibility of creating a cycle among candidate sub-graphs is detected, and the cycle is eliminated by further partitioning one of the candidate sub-graphs.

The graph partitioning begins by placing all operations with assigned locations into a sub-graph of their own. The locations may be assigned based on, for example, location restrictions associated with the operations. For example, some operations may have particular requirements, where only some computing devices at particular locations in the distributed architecture are capable of executing the operation in accordance with those restrictions. Such restrictions and capabilities may be recognized by the programming model, which may automatically assign a location to the operation accordingly. The partitioning may include reducing a number of sub-graphs with operations assigned to a particular location.

Over the course of the partitioning algorithm, the unassigned operations are placed into the location-assigned sub-graphs, and sub-graphs are merged together as much as possible. In performing the algorithm, a number of main constraints are applied, wherein the constraints ensure that the final graph and the assignment of locations to operations are such that, when the program represented by the graph is executed, communication among the operations in the graph is efficient. In particular, all operations must be placed into a sub-graph, the algorithm must assign a location to each sub-graph, an operation with a programmer-assigned location must retain that assignment, and an unassigned operation may only be placed into a sharded location if it has a splittable property. Further, if a location is sharded, all edges in the program whose destination operation is assigned to that location remain unchanged throughout the algorithm. Moreover, the graph must be acyclic.

The graph partitioning may be performed in two phases. In a first phase, the main partitioning is performed while in a second phase, local partitioning is performed. One purpose of the first phase is to determine an assignment of nodes in the graph to locations, such that communication among locations is minimized when the program represented by the graph is executed. One purpose of the local partitioning is to improve and optimize implementation of a program and operations that are allocated to the same location. The main partitioning may include merging sharded sub-graphs, growing sharded sub-graphs, assigning unsharded locations, and merging unsharded sub-graphs. A sub-graph is sharded, if all nodes are assigned to the same sharded location. As a result of the main partitioning, each subgraph is assigned either a sharded or unsharded location and all nodes in the same subgraph have the same location as the sub-graph. The local partitioning may include identifying sub-graphs that need to be split, preparing the graph for splitting, building merge graphs, merging sub-graphs with external incoming edges, and merging sub-graphs with non-blocking operations.

In the first phase of main partitioning, a first step merges as many sharded sub-graphs as possible. As a result, a total number of sub-graphs in the program is minimized. The next step is to grow sharded sub-graphs by folding neighboring unassigned nodes into them. Candidate operations are first checked to determine whether they have been marked as splittable. If not, they are not folded. If they are splittable, placing those candidates into the neighboring sub-graphs is limited by the main partitioning constraints. In a next step of assigning unsharded locations, locations are assigned to all unassigned operations by copying locations from assigned nodes to their neighbors. A next step includes merging unsharded sub-graphs attempts to minimize the total number of sub-graphs by merging together all possible pairs of unsharded sub-graphs that run at the same location. At some point, further merging will not be possible. For example, when every operation is assigned to a sub-graph and have the number of sub-graphs is minimized, any further merges would either introduce a cycle into the graph or break one of the constraints. At this point, blocking operations can be split out into a sub-graph of their own, creating local graphs that are executed on the same machine. Blocking operations are operations that might have to do input/output, and therefore might hold onto a thread while performing I/O, preventing further operations from being able to run.

In the second phase of local partitioning, locations are already assigned. Moreover, sharded locations can be split just like un-sharded locations. A location may sharded if, for example, it includes multiple shards. However, the split into multiple local sub-graphs must satisfy a set of local constraints, requiring that each blocking operation must end up in a sub-graph of its own, the split may produce only one sub-graph with external (non-local) inputs, and sub-graphs and edges between the sub-graphs must be acyclic. Requiring that the split product only one sub-graph with external inputs ensures that external graphs communicate with a single local graph, which enables more send/receive optimizations and simplifies protocol.

A first step of the local partitioning is to identify sub-graphs that need to be split. These sub-graphs can simply be those containing blocking operations. In a next step, the graphs is prepared for splitting. This may include modifying the sub-graph to enforce the local partitioning constraints. For example, the modification may insert no-ops before and after each blocking operation. Inserting the no-op before the blocking operation ensures that there are no blocking operations with external inputs in the sub-program. Inserting the no-op after the blocking operation ensures that there are no blocking operations with external outputs in the sub-program.

In a next step of the local partitioning, a merge graph is built where each operation ends up in a sub-graph of its own. These sub-graphs are then repeatedly merged together. Specifically, all operations having external incoming edges are merged together into the same sub-graph. Further, all possible pairs of sub-graphs that have non-blocking operations are merged.

Once partitioned, the graph may be executed. Each of the sub-graphs is executed at their respective locations, and each sub-graph is executed in a respective single thread. Data transfers along edges within a sub-graph are optimized based on their execution within a single-threaded environment.

Figure 12:
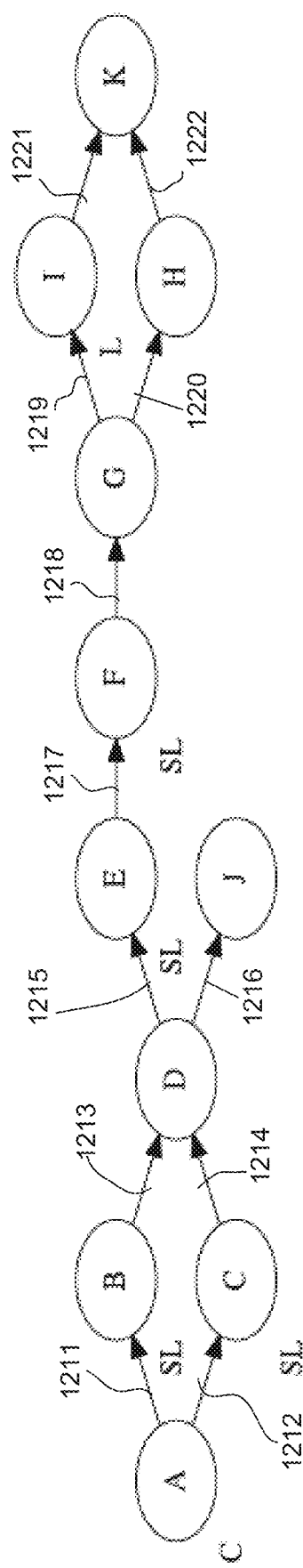
FIG. 12 illustrates an example program according to aspects of the disclosure.

FIG. 12 illustrates an example program. FIGS. 13A-13F describe main partitioning of the program, while FIGS. 14A-14E describe an example of local partitioning. The resulting program is shown in FIG. 15.

As shown in FIG. 12, an initial graph for the program is created. The graph includes a plurality of nodes A-K representing various operations, with edges 1211-1222 representing streams of data flowing between the nodes. Some of the nodes have predefined locations. For example, the operations of node A are assigned to location C, while the operations of node I are assigned to location L. The operations of each of nodes B, C, E, and F are assigned to sharded location SL. During partitioning, locations will be automatically assigned to the remaining nodes D, J, G, H, and K.

Figure 13A:
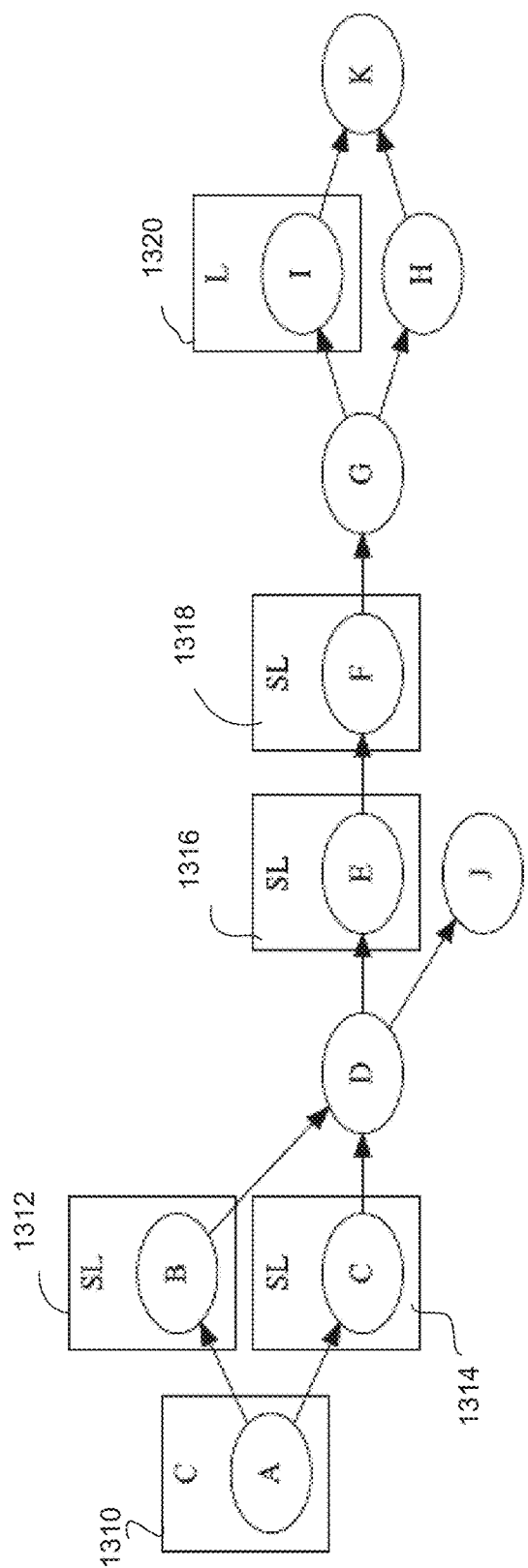
FIGS. 13A-13F describe an example of main partitioning of the program of FIG. 12 according to aspects of the disclosure.

In FIG. 13A, each node having a predefined location is placed into its own sub-graph. For example, node A is placed in sub-graph 1310, node B is placed in sub-graph 1312, node C is placed in sub-graph 314, node E is placed in sub-graph 1316, node F is placed in sub-graph 1318, and node L is placed in sub-graph 1320. During partitioning, nodes with unassigned locations are placed into these sub-graphs 1310-1320, and sub-graphs are merged to the extent possible. This is performed in accordance with the main partitioning constraints mentioned above.

Figure 13B:
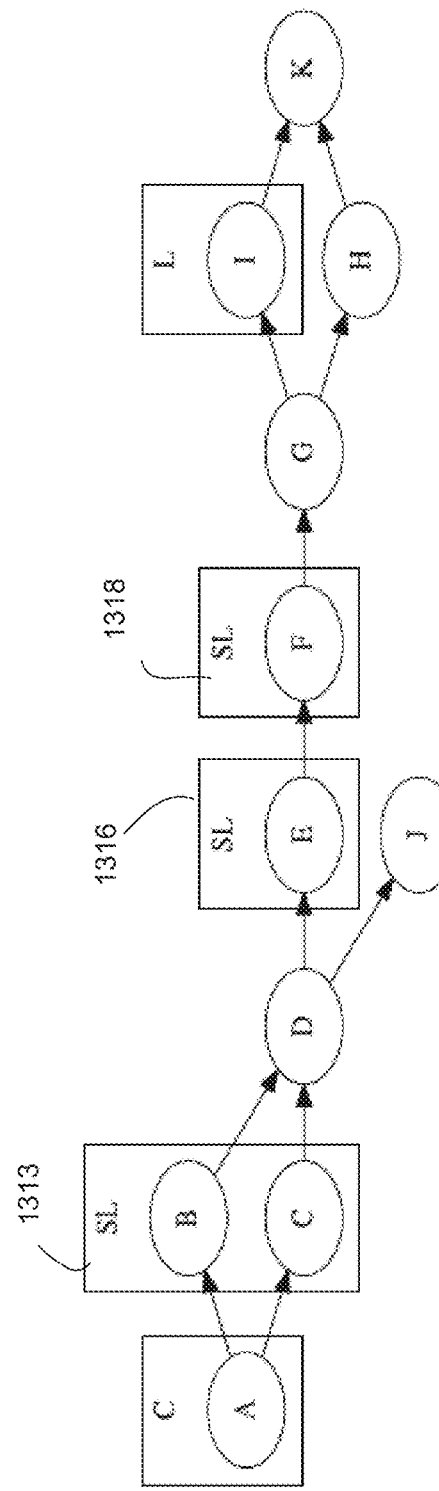

FIG. 13A is transformed into FIG. 13B, for example, by merging sharded sub-graphs to the extent possible while adhering to the main partitioning constraints. Candidates for the merge include nodes B, C, E, and F. Nodes A and I are not candidates because they are not assigned to sharded locations. Neither node B nor node C can be merged with either nodes E or F, as it would introduce a cycle into the graph. Sub-graphs 1316 and 1318 also cannot be merged together, because a send node in a sharded location cannot be merged with its destination if the destination node is also in a sharded location. Nodes B and C can be merged, and are merged into the same sub-graph 1313.

Figure 13C:
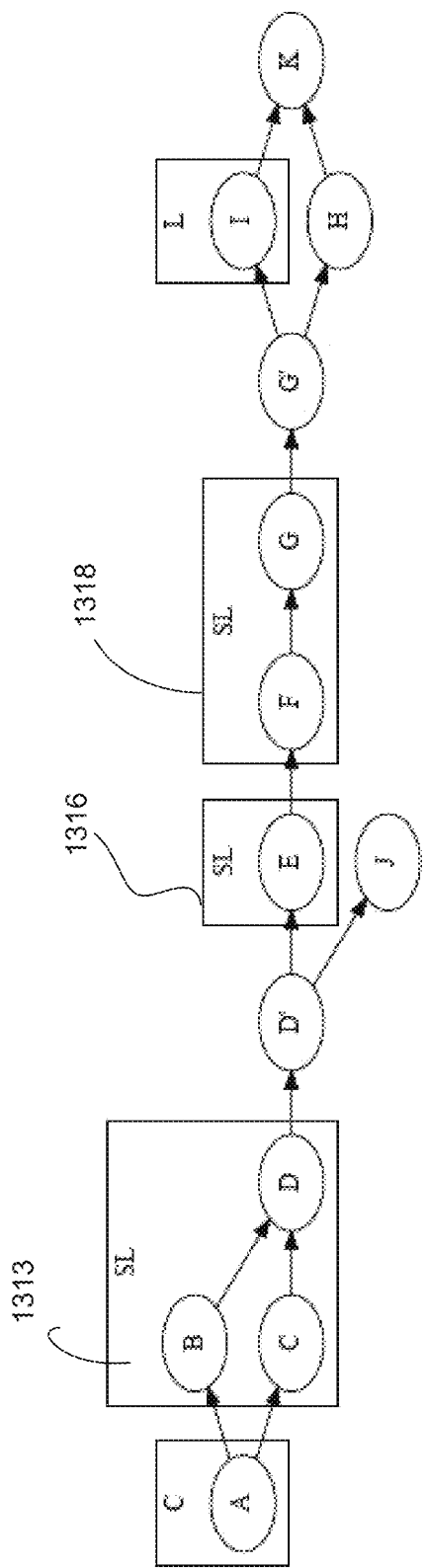

FIG. 13B is transformed into FIG. 13C, for example, by growing sharded sub-graphs. Such growing includes adding neighboring nodes with unassigned locations into the sharded sub-graphs. Nodes D and G are candidates to be folded into sharded sub-graphs, because they have unassigned locations and also have edges coupled to nodes within sharded sub-graphs. It is determined whether nodes D and G have been marked as splittable. If not, they are dropped as candidate. If they are marked as splittable, they are placed into neighboring sub-graphs. Operation D cannot be placed into sub-graph 1316 with node E, because of the constraint that the set of edges whose destination operation is assigned to a sharded location must remain unchanged. Operation D is added to sub-graph 1313. This would not have been possible if nodes B and C had not previously been merged into the same sub-graph, because it would not abide by the main partitioning constraints.

By adding node D into sub-graph 1313, the operation of node D is effectively sharded. Accordingly, new operation D' is added to the graph to merge the results from the sharded instances of D. Similarly, the operation of node G is placed into sub-graph 1318 with node F, and new operation G" is added to the graph. The new operations D' and G' are not splittable. There are no further operations in FIG. 13C that can be placed into sharded locations.

Figure 13D:
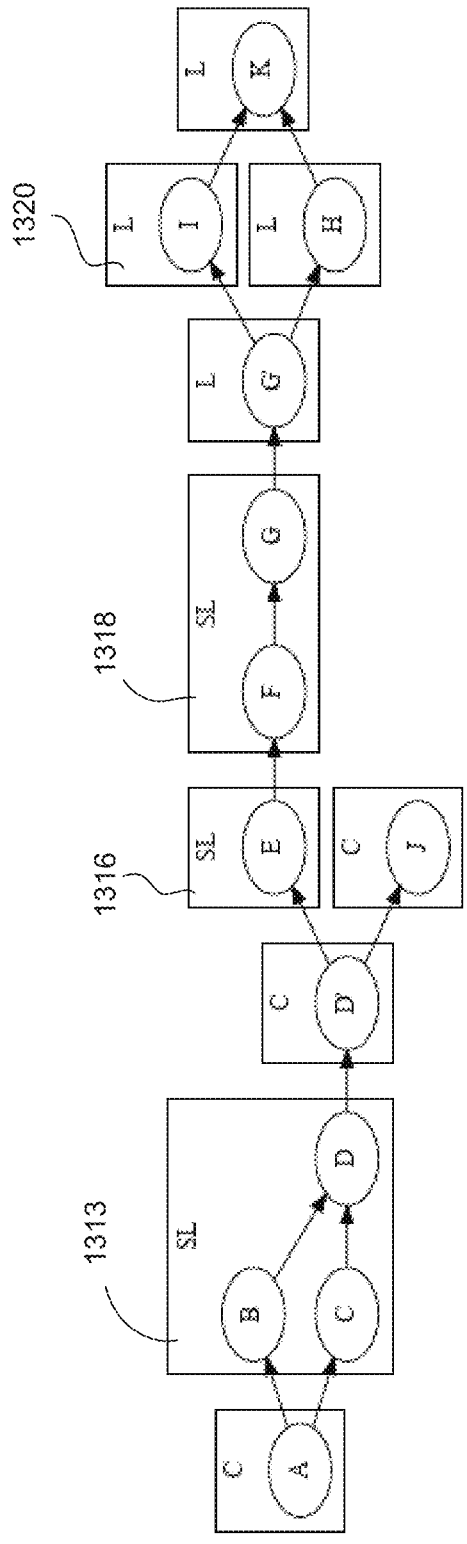

FIG. 13D illustrates assigning locations to all unassigned locations. This may be performed by copying locations from assigned nodes to their neighbors. For example, nodes D', J, G', H, and K had unassigned locations in FIG. 13C. Nodes G', H, and K are neighbors of sub-graph 1320 which includes node I. Accordingly, the location L assigned to node I is also assigned to nodes G', H, and K. Nodes D' and J do not have any neighboring unsharded sub-graphs, and so nodes D' and J are assigned to controller C.

Figure 13E:
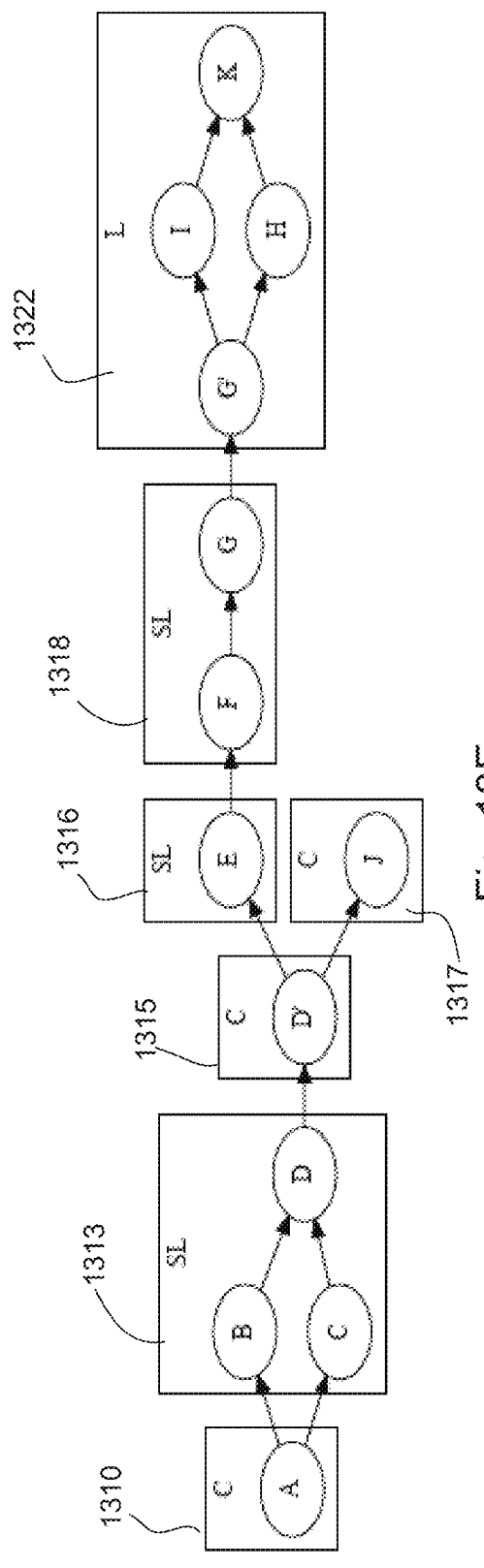
Figure 13F:
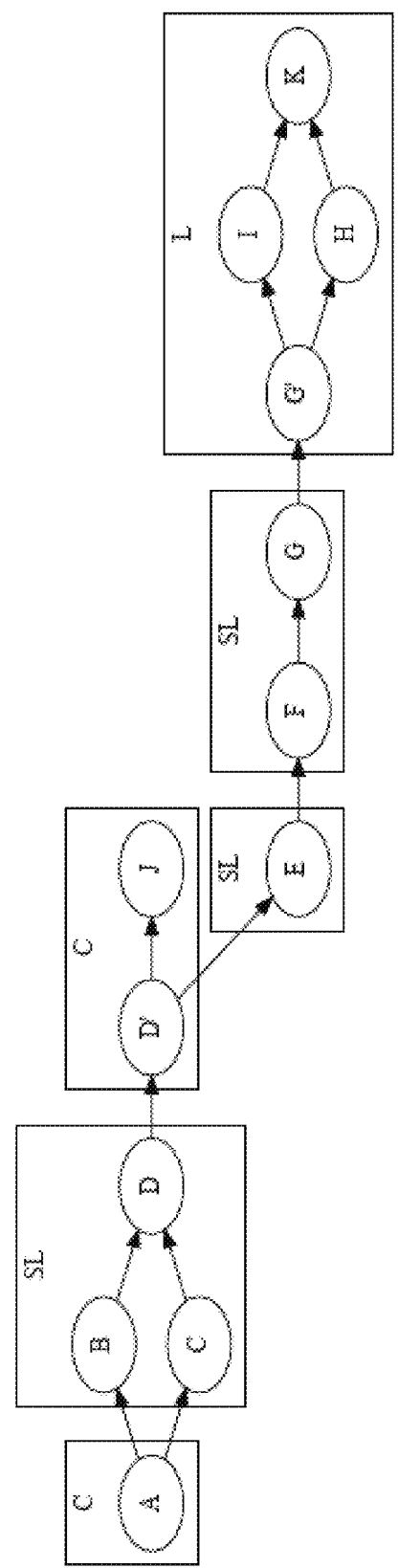

FIGS. 13E-F illustrate an example of merging unsharded sub-graphs. The total number of sub-graphs are minimized by merging together all possible pairs of unsharded sub-graphs that run at the same location. There are three sub-graphs assigned to location C (1310, 1315, 1317). Also, the sub-graphs of nodes G', H, I, and K are all assigned to location L. All sub-graphs assigned to location L can be merged into new sub-graph 1322 without introducing a cycle. Sub-graph 1310 including node A cannot be merged with sub-graph 1315 or 1317 without introducing a cycle. Sub-graphs 1315 including node D' and sub-graph 1317 including node J, however, can be merged. A resulting graph is illustrated in FIG. 13F. This graph cannot be further merged. Each operation has been assigned to a sub-graph, and the number of sub-graphs has been minimized. Any further merges would break one of the main partitioning constraints.

Blocking operations may be split out into a sub-graph of their own, creating local graphs that are executed locally on the same machine. During local partitioning, locations are already assigned. Moreover, special considerations need not be taken for sharded locations, which can be split during the local partitioning phase. The local partitioning must adhere to the local partitioning constraints mentioned above. These local partitioning constraints require that each blocking operation ends up in a sub-graph of its own, splitting sub-graphs may only produce one sub-graph with external/non-local inputs, and the graph must remain acyclic. Ensuring that splitting produces only one sub-graph with external inputs enables more send and receive optimizations, and simplifies the programming protocol. In the graph, an external/non-local input is represented by an edge between nodes that have been assigned different locations. An external edge results in possible communication between nodes during execution of the program.

Figure 14A:
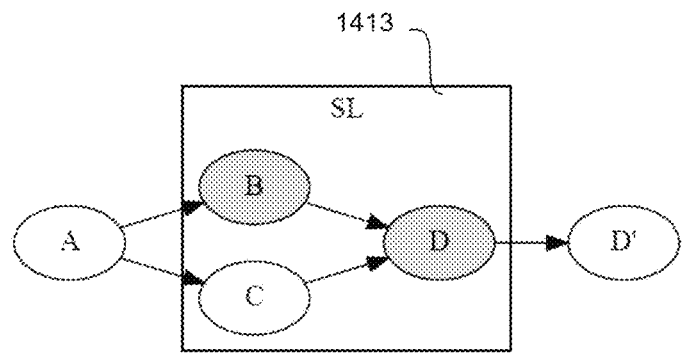
FIGS. 14A-14E describe an example of local partitioning of the program of FIG. 12 according to aspects of the disclosure.
Figure 15:
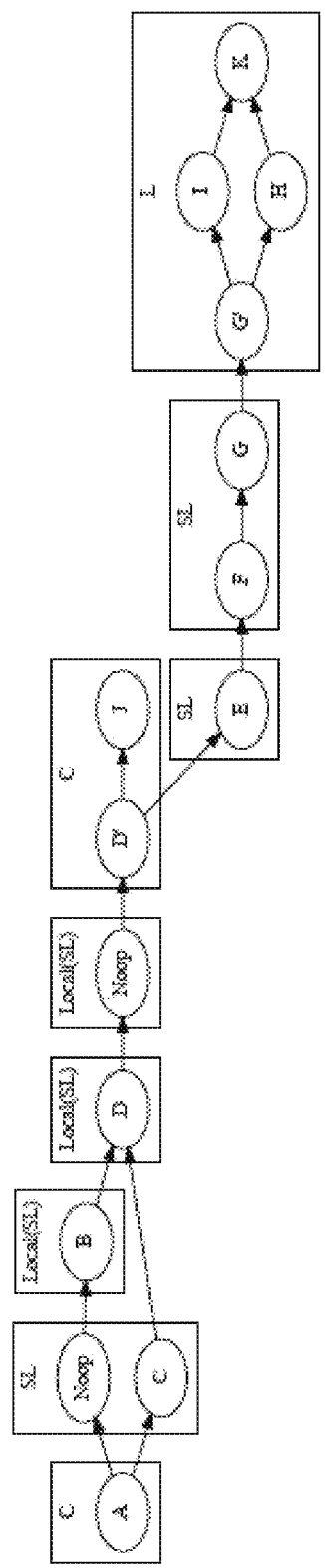
FIG. 15 illustrates the program of FIG. 12 after main partitioning and local partitioning are performed according to aspects of the disclosure.

In FIG. 14A, sub-graphs containing blocking operations are identified. In this example, operations B and D are the only blocking operations in the program. Accordingly, sub-graph 1413 including nodes B, C, and D is to be split.

Figure 14B:
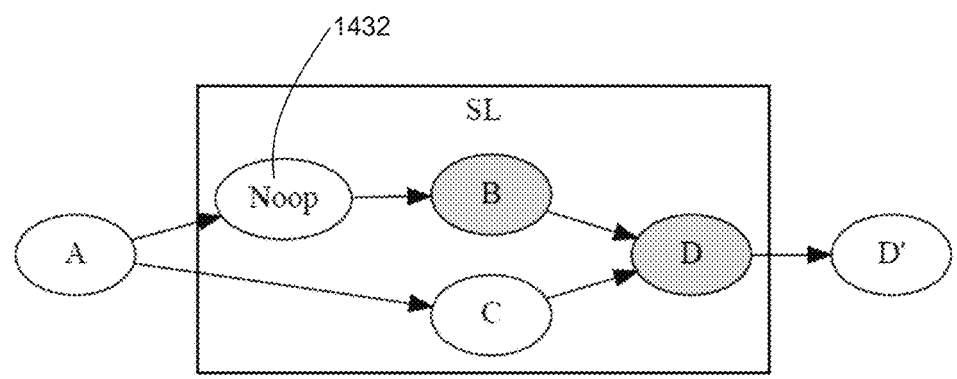
Figure 14C:
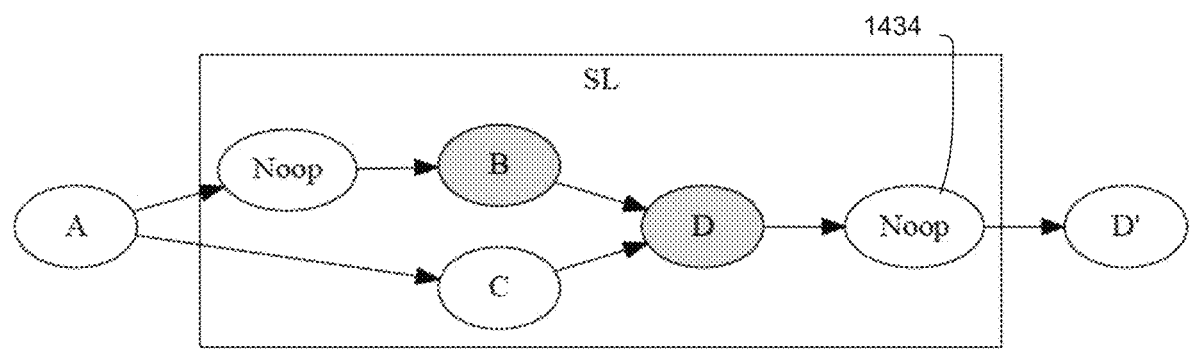

In FIGS. 14B-14C, the sub-graph 1413 of FIG. 4A is modified in order to enforce the local partitioning constraints. A first modification shown in FIG. 14B ensures that there are no blocking operations with external inputs in the sub-graph. Multiple blocking operations with external inputs would make it difficult or impossible to enforce the local partitioning constraints requiring that each blocking operation ends up in a sub-graph of its own, and that the graph remain acyclic. The first modification inserts no-operations just before the blocking operations. A no-operation, or "no-op" is an operation that does not change program semantics if inserted between two operations. An example of a no-op is Interleave. Interleave passes data from a node before it to a node after it. Because blocking operation B has an external input from node A, a No-op operation 1432 is inserted between nodes A and B.

A second modification, shown in FIG. 14C, ensures that there are no blocking operations with external output in the sub-graph. This prepares the sub-graph for a final partitioning step where special send and receive operations are inserted along those outputs, and ensures that the send operations do not end up in the same sub-graph as the blocking operation. Accordingly, the second modification inserts another No-op operation 1434 between nodes D and D'.

Figure 14D:
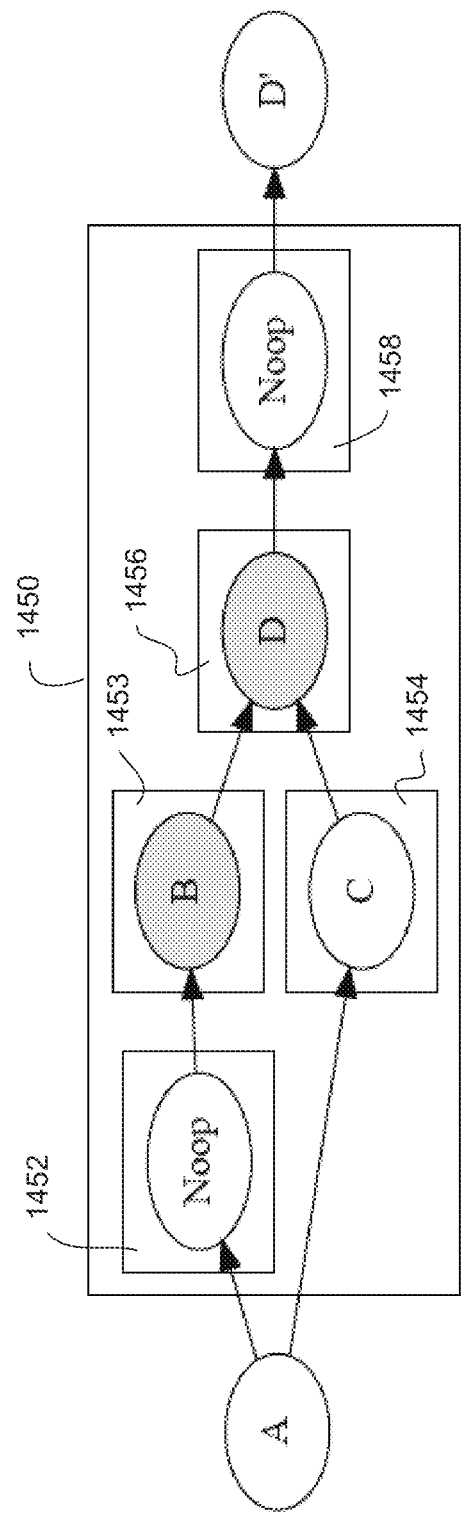

FIG. 14D illustrates building of a merge graph, where each operation ends up in a sub-graph of its own. As shown, merge graph 1450 includes sub-graphs 1452, 1453, 1454, 1456, and 1458, each including one operation.

Figure 14E:
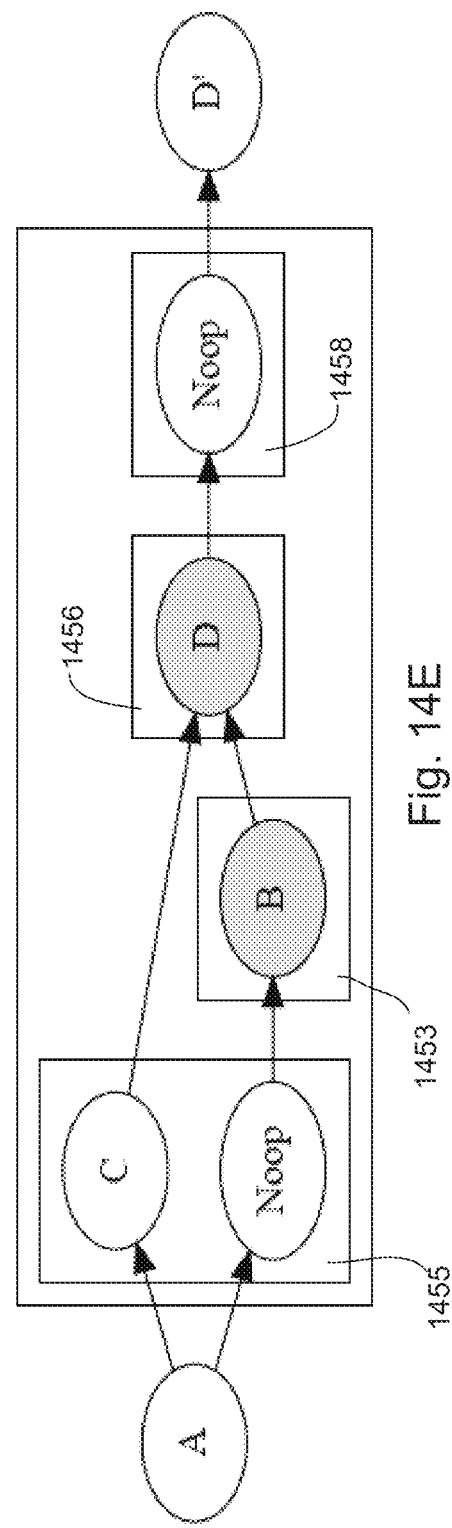

In FIG. 14E, operations having external incoming edges are identified and merged together into the same sub-graph. Because nodes C and the first No-op operation both have external edges incoming from node A outside the merge graph 1450, sub-graphs 1452 and 1454 of FIG. 14D are merged together into sub-graph 1455 of FIG. 14E.

Sub-graphs having non-blocking operations are merged to the extent possible. In FIG. 14E, there are two sub-graphs 1455, 1458 containing Noop operations. However, merging those two sub-graphs 1455, 1458 would introduce a cycle, and thus is not permissible. Because sub-graph 1453 including node B and sub-graph 1456 including node D have blocking operations that cannot be merged with any other sub-graphs, the local partitioning is complete.

FIG. 15 illustrates the final program, after main and local partitioning. Locations have been assigned to each location in such a way to minimize traffic sent across networks from one location to another. Moreover, precautions have been taken to ensure efficiency, for example, by preventing cycles and optimizing sending and receiving between nodes.

Figure 16:
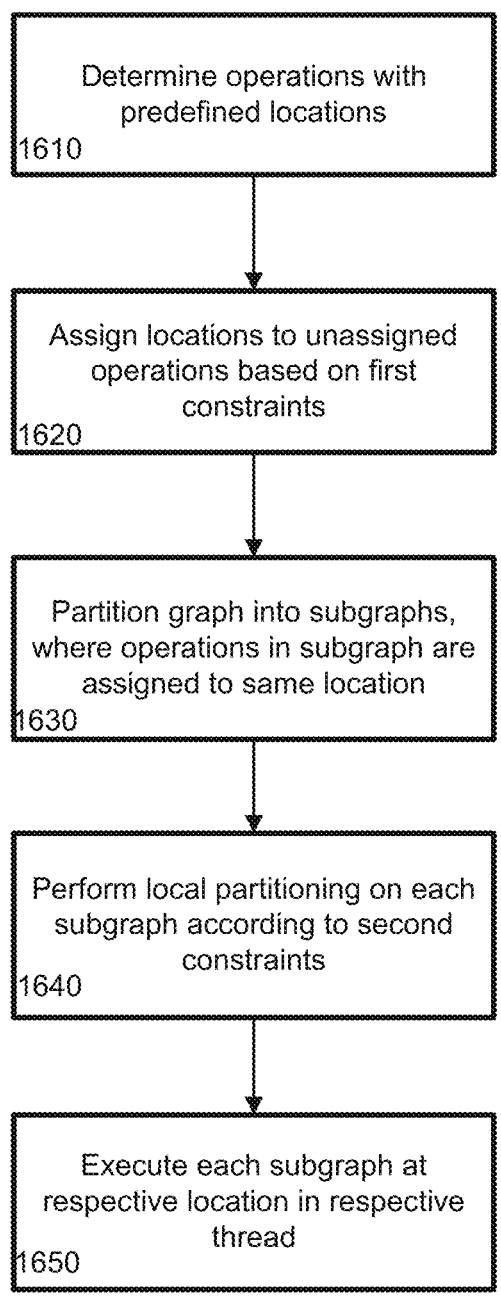
FIG. 16 provides a flow diagram illustrating an example method of graph creation and partitioning according to aspects of the disclosure.

FIG. 16 provides a flow diagram illustrating an example method 1600 of graph creation and partitioning for a created program. Some parts of the method 1600 are described in further detail in connection with FIGS. 17-18. Each of the methods described herein includes parts which may be performed in a different order or simultaneously, and additional parts may be included with other parts may be omitted.

In block 1610, a directed acyclic graph is created, including nodes representing the operations for the program. The nodes in the graph are joined by edges, representing streams of data flowing from one operation to another. Some of the operations may have predefined locations. Such locations may be determined by, for example, properties of the operation, capabilities of computing devices in the distributed environment, programmer assignment, or any other information.

In block 1620, locations are assigned to any operations without a predefined location. The locations may be assigned based on a first set of constraints, such as the main partitioning constraints described above. In some examples, the first set of constraints requires that all operations be placed into a sub-graph, that a location be assigned to each sub-graph, that an operation with a programmer-assigned location must retain that assignment, and that an unassigned operation may only be placed into a sharded location if it has a splittable property. Further, if a location is sharded, all edges in the program whose destination operation is assigned to that location remain unchanged throughout the algorithm. Moreover, the graph must be acyclic. The locations may be assigned by, for example, based on neighboring nodes. For example, operations with unassigned locations may be added into adjacent sharded sub-graphs in accordance with the constraints. Any further operations with unassigned locations may be assigned locations to match neighboring unsharded nodes. The location assignment may be part of graph partitioning.

In block 1630, the graph is partitioned into a plurality of sub-graphs where operations in a sub-graph are assigned to the same location. The partitioning of block 1630 is described in further detail in connection with FIG. 17.

In block 1640, local partitioning is performed for the individual sub-graphs based on a second set of constraints, such as the local partitioning constraints discussed above. The local partitioning is further described in connection with FIG. 18.

In block 1650, each sub-graph is executed at its respective location. Individual sub-graphs are executed in a single respective thread. Program execution is discussed more fully in the next section IV.

Figure 17:
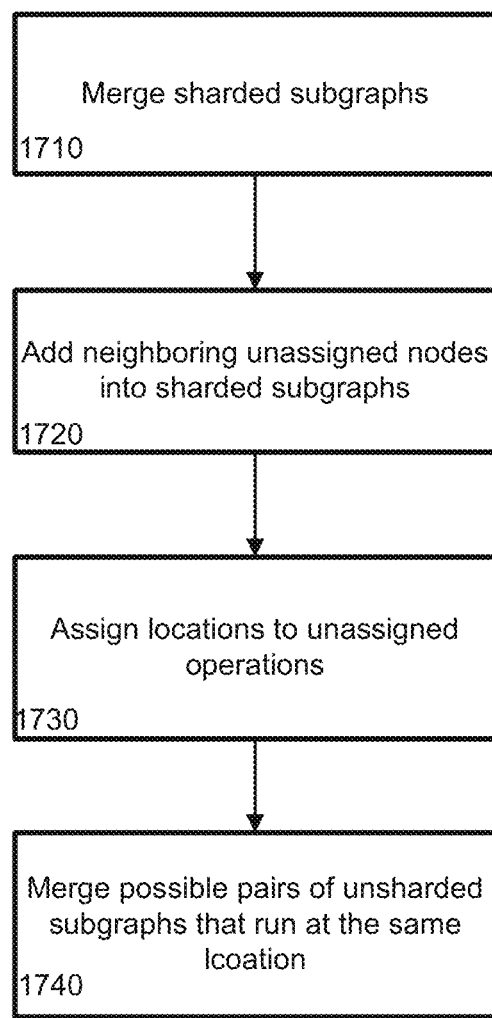
FIG. 17 provides a flow diagram illustrating a method of main graph partitioning.

FIG. 17 provides a flow diagram illustrating a method 1700 of main graph partitioning. In block 1710, sharded sub-graphs are merged to the extent possible, while adhering to the main partitioning constraints. An example was discussed above in connection with FIG. 13B.

In block 1720, nodes with unassigned locations are added into neighboring sharded sub-graphs, to the extent possible while adhering to the main partitioning constraints. An example is discussed above in connection with FIG. 13C. In some instances, this may include creation of an additional operation. For example, where a node with an unassigned location is effectively sharded when it is added to the neighboring sharded sub-graph, a new operation is added to the graph outside the sub-graph to merge the results from the sharded operation.

In block 1730, locations are assigned to any remaining nodes with unassigned locations. The locations may be assigned based on locations previously assigned to neighboring nodes, while adhering to the main partitioning constraints. An example is discussed above in connection with FIG. 13D.

In block 1740, possible pairs of unsharded sub-graphs that run at the same location are merged. An example is discussed above in connection with FIGS. 13E-F.

Figure 18:
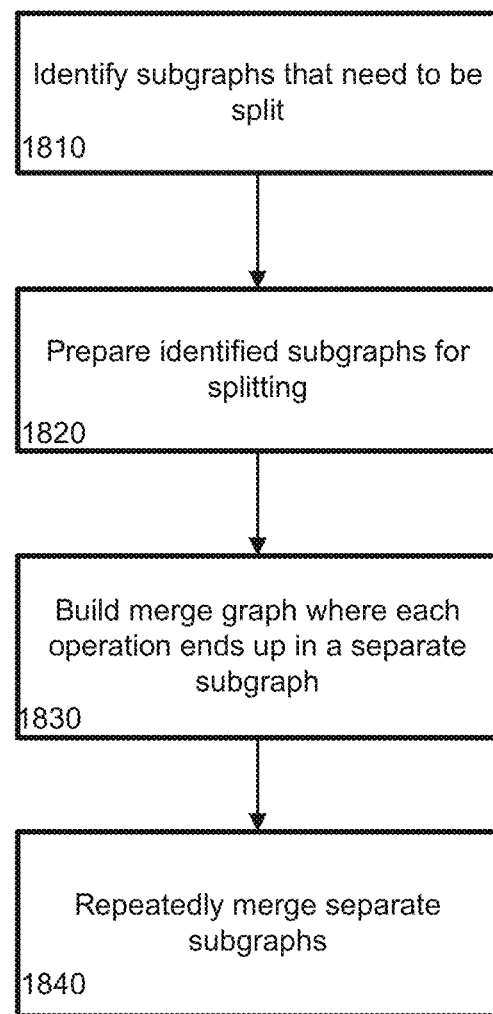
FIG. 18 provides a flow diagram illustrating an example method of local partitioning.

FIG. 18 provides a flow diagram illustrating an example method 1800 of local partitioning. In block 1810, sub-graphs that need to be split are identified. Sub-graphs may be to be split if, for example, they contain one or more blocking operations.

In block 1820, the identified sub-graphs are prepared for splitting. Preparation may include, for example, modifications to ensure that there are no blocking operations with external inputs to the sub-graph, and that there are no blocking operations with external output in the sub-graph. Such modifications may include addition of operations to the sub-graph, such as discussed above in connection with FIGS. 14B-C.

In block 1830, a merge graph is built, where each operation ends up in a separate sub-graph. An example is discussed above in connection with FIG. 14D.

In block 1840, separate sub-graphs are repeatedly merged until no further merging can be performed without breaking one of the local partitioning constraints. This method may be repeated for each relevant sub-graph in the graph.

IV. Executing a Program Across a Network

Once partitioned, the graph may be executed. Each of the sub-graphs is executed at their respective locations, and each sub-graph is executed in a respective single thread. Data transfers along edges within a sub-graph are optimized based on their execution within a single-threaded environment.

In executing the program, it is determined whether a stream sent over the graph has completed. To make this determination, an end node receives a token from each other node sending tuples to the end node indicating that the other node has finished providing input. The other node can for example be a sharded node, or shard for short. The end node adds the tokens together, and when a sum of the token equals the number of other node providing input, the end node determines that the stream is complete.

Figure 19:
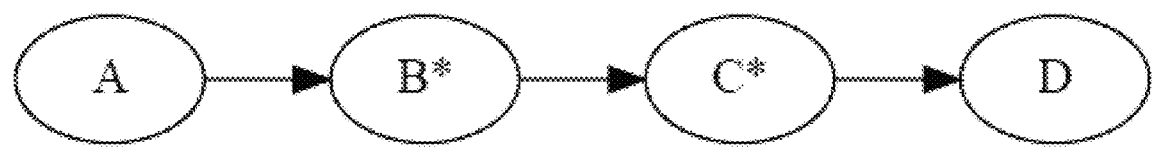
FIG. 19 is a graphical illustration of an example of a unique graph according to aspects of the disclosure.

When the program is submitted for execution, one or more activations of each graph are created. There is one activation for a unique graph. A unique graph includes a plurality of nodes which each run exactly once. An example of a unique graph is provided in FIG. 19. In this example, each of nodes A, B, C, D run once, wherein streams from A are input to B, which are input to C, which are input to D.

Figure 20:
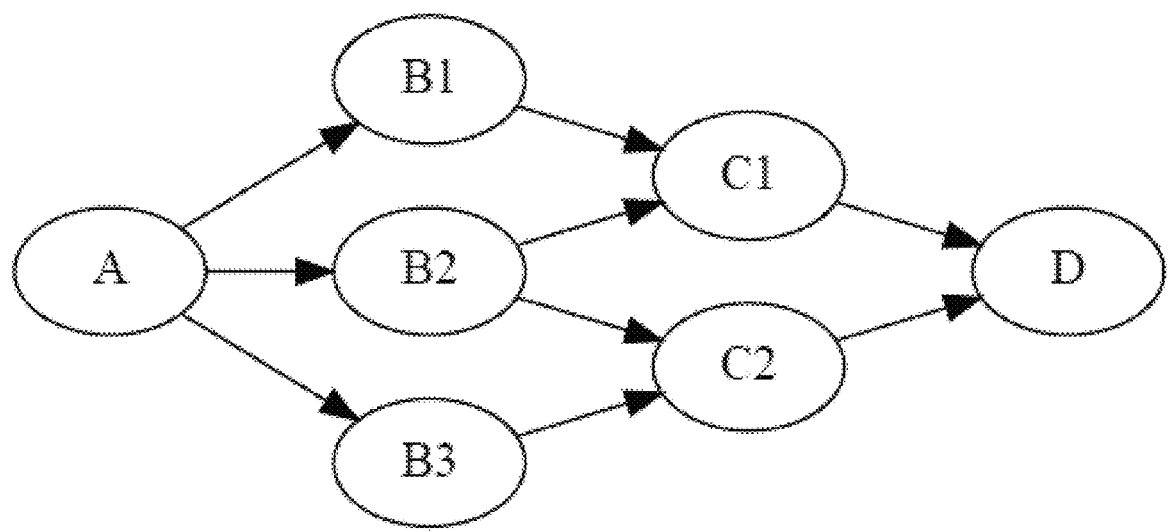
FIG. 20 is a graphical illustration of an example non-unique graph according to aspects of the disclosure.

A non-unique graph may have an arbitrary number of activation copies executed, such that inputs will be split up and sent to any of these executions and the outputs are merged together. An example of a non-unique graph is provided in FIG. 20. Multiple copies of operations B and C exist, with input from node A split among the copies of node B, etc. For example, nodes B1, B2, and B3 are activations of the same operation B. Similarly, nodes C1 and C2 are activations of the same operation C.

When activations are initialized, each node locally keeps track of a number of upstream (send nodes) and downstream nodes (receive nodes) it is connected to. Nodes inbetween the initial send node and the final receive node may serve as both send and receive nodes, receiving information from one or more nodes, performing an operation, and transmitting information to one or more further nodes. Each value sent through a stream is a tuple. Different operations in the same program may run on different machines. The programming model coordinates the execution of these operators on different machines and propagates data from one operator to another.

Because operators are running on different machines, and thus at different nodes of the graph, portions of the program are running in parallel. To determine whether a particular stream is complete, the destination node sums a number of token values received from upstream operators of shards. For example, when input to a send node ends, the send node transmits a token value (e.g. 1) to every node to which it has transmitted information. When the destination node receives token values totaling a number of send nodes to which it is connected, the destination node determines that the stream has ended. Accordingly, the destination node may take an action, such as generating an end signal or marking the stream as being finished. In one example, the destination node sends a completion token to further downstream nodes.

Figure 21:
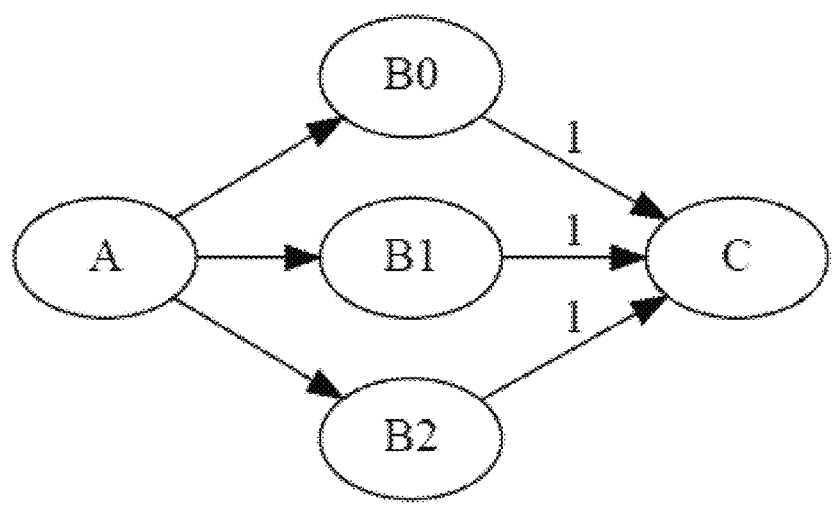
FIG. 21 illustrates an example of sending token values signaling completion of a stream according to aspects of the disclosure.

FIG. 21 illustrates an example of sending token values signaling completion of a stream. Each of nodes B0, B1, and B2 receive input from one node A. When node A has completed sending streams, it sends a token value, such as 1, to each of connected downstream nodes B0, B1, B2. The nodes B0, B1, B2 will wait to receive token values equal to the number of senders, in this case 1. Each of nodes B0, B1, B2 in turn sends streams to a single destination node C. Destination node C knows that it receives input from three different nodes B0, B1, B2, and so it waits to receive token values equal to 3. When the nodes B0, B1, B2 finish sending streams, they send a token value to the connected downstream nodes, i.e., destination node C. The destination node C sums the token values receives and compares it to the number of nodes from which it receives input. When the number is equal, the node C will mark itself as done.

Figure 22:
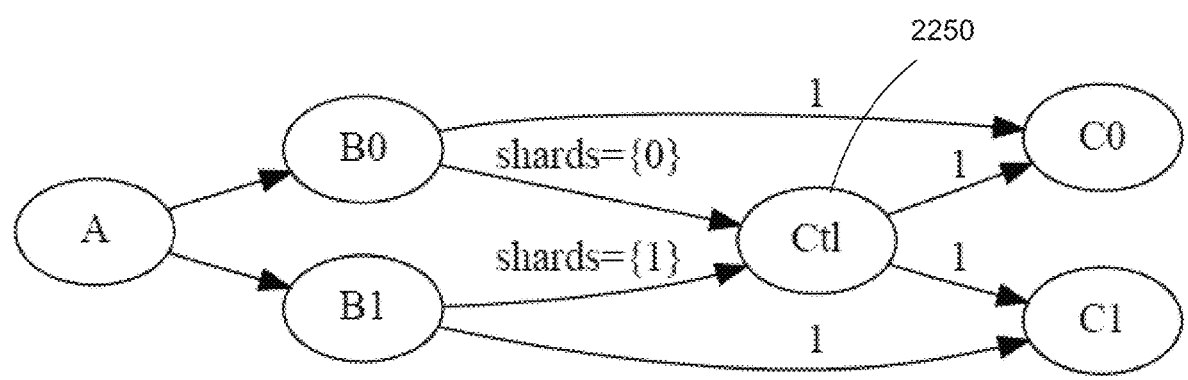
FIG. 22 illustrates an example in which a send node only sends streams to a subset of the receive nodes to which it is connected.

FIG. 22 illustrates an example in which a send node only sends streams to a subset of the receive nodes to which it is connected. For example, nodes B and C are sharded, but only some of the shard-pairs communicate. B0 may only contact shard C0 and not shard C1, while shard B1 only contacts shard C1 and not shard C0. In this scenario, the send node may generate a list of all receive shards to which it has communicated, and may further provide this list to a controller 2250. The list may, for example, be included in a message indicating that the send shard has completed its transmissions for the stream. The controller tracks all receive shards that have begun processing. If a particular shard has been started but is not present in the list, the controller assumes responsibility for that particular shard and sends it a token value on behalf of the send shard.

Figure 23:
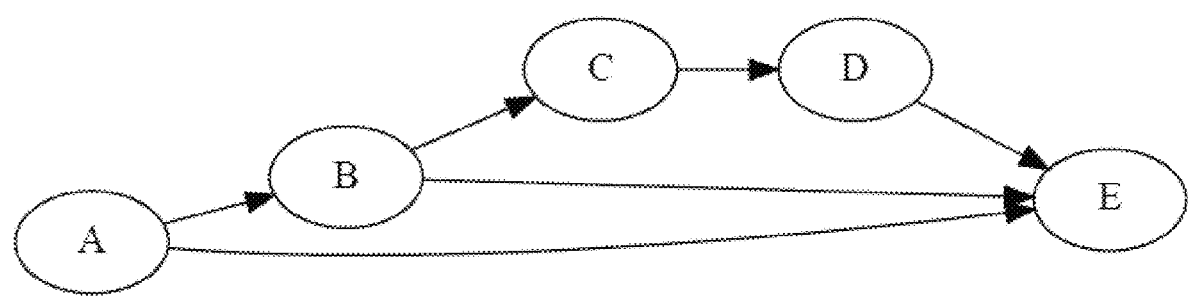
FIG. 23 illustrates an example of determining completion of a stream when there are unstarted send nodes.

FIG. 23 illustrates an example where some send nodes may not begin processing. For example, nodes C and D may be skipped by node B, and tuples are provided from a send node preceding the skipped node directly to the destination node E. Another possibility is that nodes B, C, and D are all skipped by node A, which provides tuples directly to destination node E. In either case, the controller takes over responsibility for delivering tokens from all shards of the graph. The controller simulates execution of skipped nodes B, C, and D, and delivers token values to downstream receivers (node E) on behalf of these unstarted send nodes. The downstream receivers may sum the token values to determine whether the stream has completed.

As mentioned above, graphs for the program may be unique or non-unique, wherein a shard of a unique graph runs once and a non-unique graph may have an arbitrary number of copies executed for one or more shards. For example, in a non-unique graph, inputs are split among the copies, and outputs are merged together. In graphs where each send node is not uniquely paired with one receive node, the receive node may locally keep track of a number of send nodes, and determine that a stream is complete when it receives a number of tokens equal to the number of send nodes.

Each send operation shard may have its own non-unique receiver. In this instance, the sender just sends a 1 and the corresponding non-unique receiver is done when it receives 1. An optimization to share the same execution of a non-unique receiver across multiple senders may be introduced. Then, the number of senders is locally tracked by the receiver, and the non-unique receiver is done when it has received tokens equal to the number of receivers.

In other examples, a non-unique sender may send streams to a unique receiver. Each non-unique sender sends a token value of 1 to the unique receiver and the unique receiver waits for a total of token values equal to the number of non-unique senders. When the non-unique sender is done, it sends the list of receive shards to which it has already sent tokens and the controller is responsible for delivering the remaining tokens to each shard. In other examples, the controller may deliver the all tokens for the non-unique senders to each receive shard.

Figure 24:
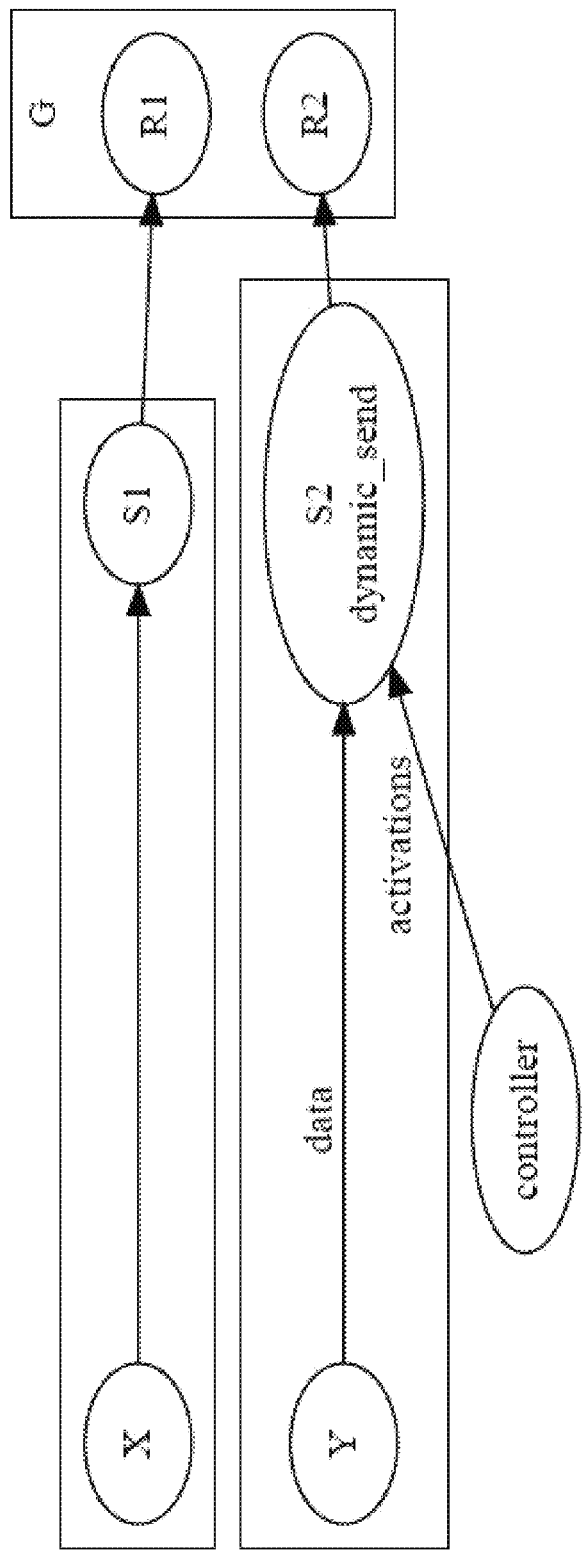
FIG. 24 illustrates an example of determining completion of a stream when there are multiple activations of a graph.

In some examples, some streams may be broadcast to all activations of a graph. However, the set of activations is not known at a time the program is constructed, and the set is built up as program execution proceeds. FIG. 24 illustrates an example where a non-unique graph G receives a regular input X on shard R1 that can cause multiple activations of G. For example, G may be sharded, or the sender S1 to R1 may have multiple activations that reach different copies of G. Another input Y should be broadcast to every copy of G. For every such broadcast, a dynamic send operation S2 is introduced. The dynamic send operation S2 has two input streams—a data input stream from Y and an activation input stream from controller. The data input stream is a normal stream of tuples that should be sent to all activations of the destination graph G. As new activations of the destination graph are detected, the activation input stream includes activations on which tuples arrive. For example, when a copy of a particular graph is executed, an identifier is sent to the controller which routes the activation to the appropriate dynamic send operation. The dynamic send operation maintains a set of registered activations, and also maintains a buffer of all input data received. When data input ends, an end signal is sent from the dynamic send operation to all registered and new activations, and also to new activations that arrive afterwards. When the activation input ends, the buffer of input data can be discarded.

FIG. 25 provides a flow diagram illustrating an example method 2500 for executing a program over a distributed network, the program represented by a graph including a plurality of nodes representing operations with edges representing streams of data interconnecting the nodes. As in the example above, the sub-parts of the method 2500 may be re-ordered, supplemented, or reduced.

In block 2510 operations are executed by one or more first shards. For example, the first shards may be send shards in a graph.

In block 2520, tuples based on the executed operations are sent from the one or more first shards to at least one second shard, such as a receive shard.

In block 2530, when the one or more first shards have completed sending the tuples, each of the one or more first shards send a token value to the at least one second shard. The token value may be, for example, 1. The one or more first shards may further note locally that transmission of the tuples is complete.

In block 2540, the at least one second shard sums the received token values, and determined whether the sum matches a number of the one or more first shard. For example, the at least one second shard may know that it receives input from three send shards. Accordingly, the at least one second shard waits until it receives a total of 3 tokens before it considers the stream to be complete.

In block 2550, the at least one second shard takes an action in response to determined that the sum of the token values matches the number of the one or more first shards. The action may be, for example, making a local notation, sending a message and/or token value to a further downstream node, etc.

The above-described technology provides for fast and efficient execution of programs. Moreover, the techniques described are adaptable for various types of sharded and pipelined programs. Even further, the techniques may be applied during writing of a program, and thus dynamically adapt to changes in the program. The new programming model supports an unbounded number of shards, each transmitting tuples across the database to other shards. While only some subset of the shards may actually run for a particular program, the controller compensates for the shards that do not run, without significant burden to the controller.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A method, comprising:
   generating a graph for a program, the graph including a plurality of nodes and edges, wherein each node of the graph represents an operation and edges between the nodes represent streams of data input to and output from the operations represented by the nodes;
   determining, with one or more processors, where in a distributed architecture to execute the operations represented by the nodes, the determining comprising:
   determining which nodes have location restrictions;
   assigning locations to each node having a location restriction based on the restriction;
   partitioning the graph into a plurality of subgraphs, the partitioning including assigning locations to nodes without location restrictions in accordance with a first set of constraints, wherein each node within a particular subgraph is assigned to the same location; and
   locally partitioning each subgraph of the plurality of subgraphs in accordance with a second set of constraints, wherein the second set of constraints is different than the first set of constraints.

2. The method of claim 1, wherein determining which nodes have location restrictions comprises identifying requirements of the operation represented by the node and determining which locations are capable of executing the operation in accordance with the requirements.

3. The method of claim 1, wherein determining which nodes have location restrictions comprises determining which nodes have predefined locations.

4. The method of claim 1, wherein the partitioning comprises reducing a number of subgraphs with operations assigned to a particular location.

5. The method of claim 1, wherein the partitioning comprises detecting a possibility of creating a cycle among subgraphs and eliminating the cycle by further partitioning the subgraphs.

6. The method of claim 1, further comprising executing each of the subgraphs at their assigned locations, wherein each subgraph is executed in a respective single thread.

7. A method for determining distribution of operations among computing devices, comprising:
   determining, with one more computing devices, which operations have predefined locations;
   creating one or more sub-graphs including each of the operations identified as having assigned locations;
   incorporating operations which do not have assigned locations into the one or more subgraphs;
   partitioning the sub-graphs in a first main phase in accordance with a first set of constraints, wherein each resulting sub-graph is assigned to a separate location; and
   partitioning each of the resulting sub-graphs in a second local phase in accordance with a second set of constraints, wherein the second set of constraints is different than the first set of constraints.

8. The method of claim 7, wherein the first main phase comprises:
   merging sharded sub-graphs;
   adding neighboring unassigned nodes into sharded sub-graphs;
   assigning locations to all unassigned operations by copying locations from assigned nodes to their neighbors;
   merging together all possible pairs of unsharded sub-graphs that run at a same location.

9. The method of claim 7, wherein the second local phase comprises:
   identifying sub-graphs that need to be split;
   preparing the identified sub-graphs for splitting;
   building a merge graph where each operation ends up in a separate sub-graph;
   repeatedly merging the separate sub-graphs together.

10. A method for determining distribution of operations among computing devices, comprising:
    creating a directed graph wherein each node represents an operation of a program and each edge represents a data communication stream between operations represented by respective nodes;
    determining, with one more computing devices, which operations have predefined locations;
    creating one or more sub-graphs including each of the operations identified as having assigned locations;
    automatically incorporating, by the one or more computing devices, operations which do not have assigned locations into the one or more subgraphs, the incorporating comprising:
    merging sharded sub-graphs;
    adding neighboring unassigned nodes into sharded sub-graphs;
    assigning locations to all unassigned operations by copying locations from assigned nodes to their neighbors; and merging together all possible pairs of unsharded sub-graphs that run at a same location.

11. The method of claim 10, further comprising applying a first set of one or more constraints to the incorporating the operations which do not have assigned locations, the first set of constraints requiring at least one of:
- all operations to be placed into the one or more sub-graphs, and a location to be assigned to each sub-graph;
- an operation with a predefined location retains that assignment;
- an unassigned operation may only be placed into a sharded location if it has a splittable property;
- if a location is sharded, all edges whose destination operation is assigned to that location remain unchanged throughout the algorithm; or
- the graph is acyclic.

12. The method of claim 11, wherein adding neighboring unassigned nodes into the sharded subgraphs comprises:
- checking candidate operations associated with neighboring unassigned nodes to determine whether they have been marked as splittable; and
- placing candidates marked as splittable into the neighboring sub-graphs.

13. The method of claim 10, further comprising:
- identifying any blocking operations in the graph, the blocking operations being operations that might hold onto a thread while performing input/output, preventing further operations from being able to run;
- splitting out each identified blocking operation into a separate sub-graph.

14. The method of claim 13, further comprising performing local partitioning on each of the subgraphs, the local partitioning comprising:
- identifying sub-graphs that need to be split;
- preparing the identified sub-graphs for splitting;
- building a merge graph where each operation ends up in a separate sub-graph;
- repeatedly merging the separate sub-graphs together.

15. The method of claim 14, wherein the local partitioning is performed in accordance with a second set of one or more constraints, the second set of constraints requiring at least one of:
- each blocking operation must end up in a sub-graph of its own,
- only one sub-graph can have non-local inputs, or
- sub-graphs and edges between the sub-graphs must be acyclic.

16. The method of claim 15, wherein preparing the identified sub-graphs for splitting comprises modifying the identified sub-graph to insert no-ops before and after each blocking operation.

17. The method of claim 14, wherein identifying the sub-graphs that need to be split comprises identifying the sub-graphs with blocking operations.

18. The method of claim 14, wherein repeatedly merging the separate sub-graphs together comprises:
- merging together into the same sub-graph all operations having external incoming edges, external incoming edges representing communications incoming from another location; and
- merging all possible pairs of subgraphs that have non-blocking operations.

* * * * *